(12) United States Patent
Kim et al.

(10) Patent No.: US 10,686,087 B2
(45) Date of Patent: Jun. 16, 2020

(54) SOLAR CELL AND METHOD FOR MANUFACTURING THE SAME

(71) Applicant: LG ELECTRONICS INC., Seoul (KR)

(72) Inventors: Chungyi Kim, Seoul (KR); Youngsung Yang, Seoul (KR); Jaewoo Choi, Seoul (KR); Mihee Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 11 days.

(21) Appl. No.: 15/600,042

(22) Filed: May 19, 2017

(65) Prior Publication Data

US 2018/0083149 A1    Mar. 22, 2018

(30) Foreign Application Priority Data

Sep. 19, 2016  (KR) .................. 10-2016-0119419
Sep. 19, 2016  (KR) .................. 10-2016-0119425

(Continued)

(51) Int. Cl.
*H01L 31/0368*  (2006.01)
*H01L 31/0745*  (2012.01)
(Continued)

(52) U.S. Cl.
CPC .. *H01L 31/03685* (2013.01); *H01L 31/02167* (2013.01); *H01L 31/03682* (2013.01);
(Continued)

(58) Field of Classification Search
CPC ............................ Y02E 10/546; Y02E 10/547
(Continued)

(56) References Cited

U.S. PATENT DOCUMENTS

2009/0314341 A1* 12/2009 Borden ........... H01L 31/022441
136/256
2013/0052725 A1    2/2013 Yazdanfar et al.
(Continued)

FOREIGN PATENT DOCUMENTS

DE    102010007695 A1    8/2011
JP    2002-299654 A     10/2002
(Continued)

*Primary Examiner* — Eli S Mekhlin
*Assistant Examiner* — Dujuan A Horton
(74) *Attorney, Agent, or Firm* — Birch, Stewart, Kolasch & Birch, LLP

(57) ABSTRACT

Disclosed is a solar cell including a control passivation film on one surface of a semiconductor substrate, and being formed of a dielectric material; and a semiconductor layer on the control passivation film, wherein the semiconductor layer including a first conductive region having a first conductive type and a second conductive region having a second conductive type opposite to the first conductive type. The semiconductor substrate includes a diffusion region including at least one of a first diffusion region and a second diffusion region adjacent to the control passivation film, wherein the first diffusion region being locally formed to correspond to the first conductive region and having a doping concentration lower than a doping concentration of the first conductive region, wherein the second diffusion region being locally formed to correspond to the second conductive region and having a doping concentration lower than a doping concentration of the second conductive region.

13 Claims, 13 Drawing Sheets

(30) Foreign Application Priority Data

Jan. 13, 2017 (KR) .................. 10-2017-0006183
Jan. 25, 2017 (KR) .................. 10-2017-0011969

(51) Int. Cl.
| | | |
|---|---|---|
| H01L 31/18 | (2006.01) | |
| H01L 31/068 | (2012.01) | |
| H01L 31/0747 | (2012.01) | |
| H01L 31/0216 | (2014.01) | |

(52) U.S. Cl.
CPC ...... *H01L 31/0682* (2013.01); *H01L 31/0745* (2013.01); *H01L 31/0747* (2013.01); *H01L 31/182* (2013.01); *H01L 31/1804* (2013.01); *H01L 31/1824* (2013.01); *H01L 31/1868* (2013.01); *Y02E 10/546* (2013.01); *Y02E 10/547* (2013.01); *Y02P 70/521* (2015.11)

(58) Field of Classification Search
USPC .................................................. 136/243–265
See application file for complete search history.

(56) References Cited

U.S. PATENT DOCUMENTS

2014/0360570 A1* 12/2014 Baek ............... H01L 31/022425
  136/256
2015/0068591 A1* 3/2015 Chan ............... H01L 31/022441
  136/256
2015/0129037 A1* 5/2015 Nam ............... H01L 31/022441
  136/259
2015/0270421 A1* 9/2015 Jeon ................... H01L 31/0682
  136/256
2016/0268455 A1 9/2016 Levy et al.

FOREIGN PATENT DOCUMENTS

| JP | 2002-368238 A | 12/2002 |
|---|---|---|
| JP | 2006-80450 A | 3/2006 |
| JP | 2011-181606 A | 9/2011 |
| JP | 2014-204128 A | 10/2014 |
| JP | 2015-144149 A | 8/2015 |
| JP | 2015-201648 A | 11/2015 |
| JP | 2015-233140 A | 12/2015 |
| JP | 2016-18998 A | 2/2016 |
| JP | 2016-46525 A | 4/2016 |
| JP | 2016-127294 A | 7/2016 |
| JP | 2017-511597 A | 4/2017 |
| JP | 2017-517147 A | 6/2017 |
| JP | 2018-508976 A | 3/2018 |
| KR | 10-2015-0029202 A | 3/2015 |
| KR | 10-2016-0063009 A | 6/2016 |
| WO | WO 2015/148571 A1 | 10/2015 |
| WO | WO 2015/183703 A1 | 12/2015 |
| WO | WO 2016/072415 A1 | 5/2016 |
| WO | WO 2016/107661 A1 | 7/2016 |

\* cited by examiner (a)  (b)

SOLAR CELL AND METHOD FOR MANUFACTURING THE SAME

CROSS-REFERENCE TO RELATED APPLICATIONS

This application claims the priority benefit of Korean Patent Applications No. 10-2016-0119425 and No. 10-2016-0119419, both filed on Sep. 19, 2016, No. 10-2017-0006183, filed on Jan. 13, 2017, and No. 10-2017-0011969, filed on Jan. 25, 2017, in the Korean Intellectual Property Office, the disclosures of all of which are incorporated herein by reference.

BACKGROUND OF THE INVENTION

Field of the Invention

Embodiments of the invention relate to a solar cell and a method for manufacturing the same, and, more particularly, a solar cell including a conductive region formed of a semiconductor material and a method for manufacturing the same.

Description of the Related Art

Recently, as existing energy resources such as petroleum and coal are depleted, interest in alternative energy sources is increasing. In particular, a solar cell is highlighted as a next-generation cell capable of converting solar energy into electric energy.

Such a solar cell may be manufactured by forming various layers and various electrodes according to desired designs. In connection with this, efficiency of the solar cell may be determined according to the designs of the various layers and electrodes. For commercial availability of such a solar cell, it is necessary to overcome problems associated with low efficiency of the solar cell. Accordingly, the various layers and the various electrodes are needed to be designed and manufactured in order to maximize the efficiency of the solar cell.

A solar cell including a conductive region formed of a separate layer from a semiconductor substrate was suggested. In this solar cell, it may be difficult to transfer carriers to the conductive region. Particularly, if another layer is positioned between the conductive region and the semiconductor substrate, this problem may be severe due to a discontinuous energy band diagram.

SUMMARY OF THE INVENTION

Therefore, the invention has been made in view of the above problems, and the invention is to provide a solar cell having enhanced efficiency and a method for manufacturing the same with high productivity.

A solar cell according to an embodiment of the invention includes a semiconductor substrate; a control passivation film on one surface of the semiconductor substrate, wherein the control passivation film being formed of a dielectric material; and a semiconductor layer on the control passivation film, wherein the semiconductor layer including a first conductive region having a first conductive type and a second conductive region having a second conductive type opposite to the first conductive type. The semiconductor substrate includes a diffusion region including at least one of a first diffusion region and a second diffusion region adjacent to the control passivation film, wherein the first diffusion region being locally formed to correspond to the first conductive region and having a doping concentration lower than a doping concentration of the first conductive region, wherein the second diffusion region being locally formed to correspond to the second conductive region and having a doping concentration lower than a doping concentration of the second conductive region.

A solar cell according to another embodiment of the invention includes a semiconductor substrate; a control passivation film on the semiconductor substrate; and a semiconductor layer on the control passivation film. The semiconductor layer includes a poly-crystalline portion having a poly-crystalline structure with a nanometer-sized grain. The semiconductor substrate includes a diffusion region having a doping concentration lower than a doping concentration of the semiconductor layer at a portion adjacent to the control passivation film.

A method for manufacturing a solar cell according to an embodiment of the invention includes forming a control passivation film on one surface of the semiconductor substrate; and forming a first conductive region having a first conductive type dopant on the control passivation film. The forming of the first conductive region includes forming an intrinsic semiconductor layer; forming a first dopant layer having the first conductive dopant on the intrinsic semiconductor layer; and doping the intrinsic semiconductor layer with the first conductive dopant included in the first dopant layer by using a laser with a defocused state. In the doping of the intrinsic semiconductor layer, a first diffusion region having a doping concentration lower than a doping concentration of the first conductive region is formed at a portion of the semiconductor substrate adjacent to the control passivation film to correspond to the first conductive region.

DETAILED DESCRIPTION OF THE EMBODIMENTS

Figure 1:
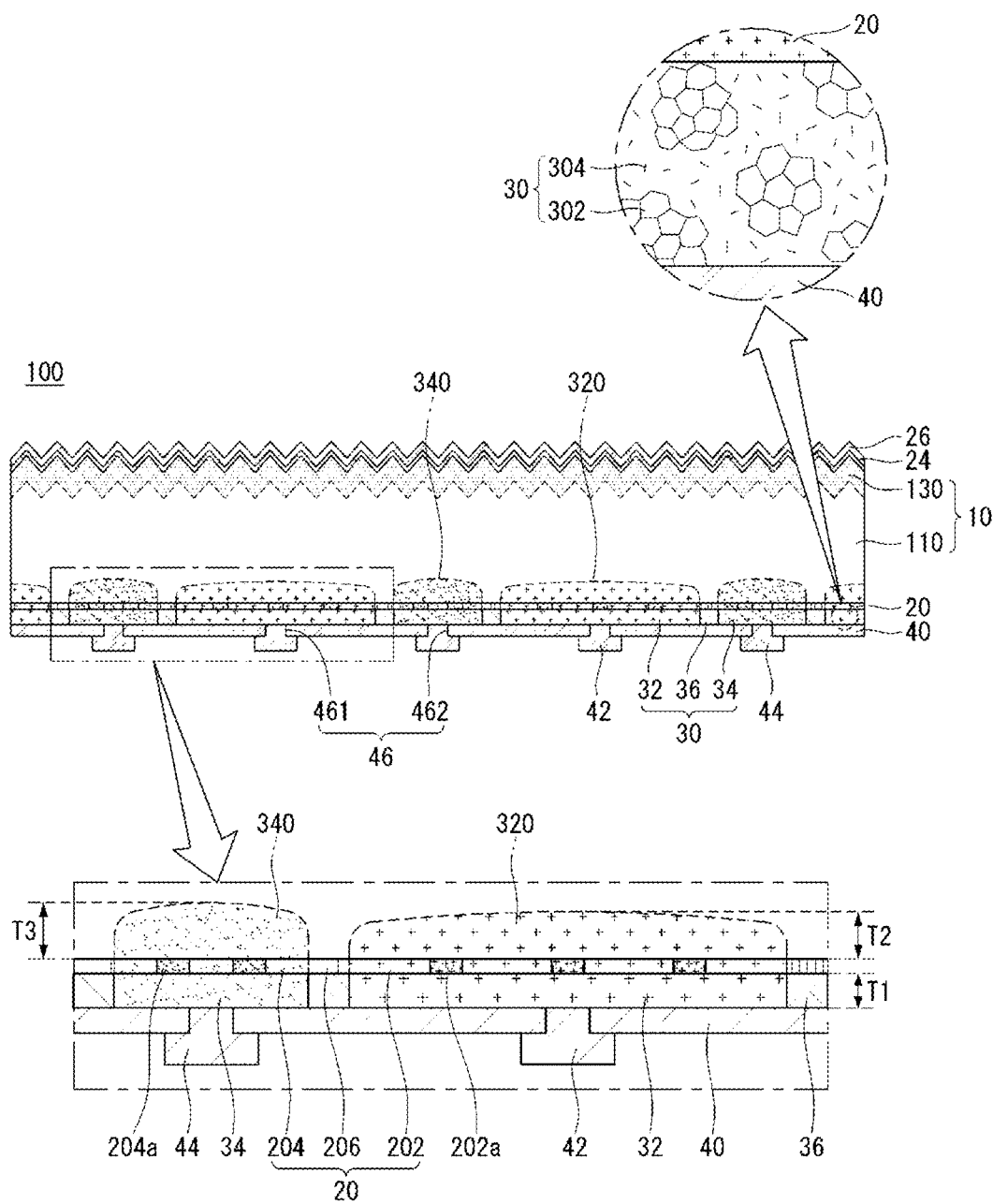
FIG. 1 is a cross-sectional view of a solar cell according to an embodiment of the invention.

Embodiments of the invention will be described in detail with reference to the accompanying drawings. The invention may, however, be embodied in many alternate forms and should not be construed as limited to the embodiments set forth herein.

In the drawings, illustration of parts having no concern with the invention is omitted for clarity and simplicity of description. The same reference numerals designate the same or very similar elements throughout the specification. In the drawings, the thicknesses, widths or the like of elements are exaggerated or reduced for clarity of description, and should not be construed as limited to those illustrated in the drawings.

It will be understood that the terms "comprise" and/or "comprising," or "include" and/or "including" when used in the specification, specify the presence of stated matters, but do not preclude the presence or addition of one or more other matters. In addition, it will be understood that, when an element such as a layer, film, region, or plate is referred to as being "on" another element, it can be directly disposed on another element or can be disposed such that an intervening element is also present therebetween. Accordingly, when an element such as a layer, film, region, or plate is disposed "directly on" another element, this means that there is no intervening element between the two elements.

Hereinafter, a solar cell and a method for manufacturing the same according to embodiments of the invention will be described in detail with reference to the accompanying drawings.

Figure 2:
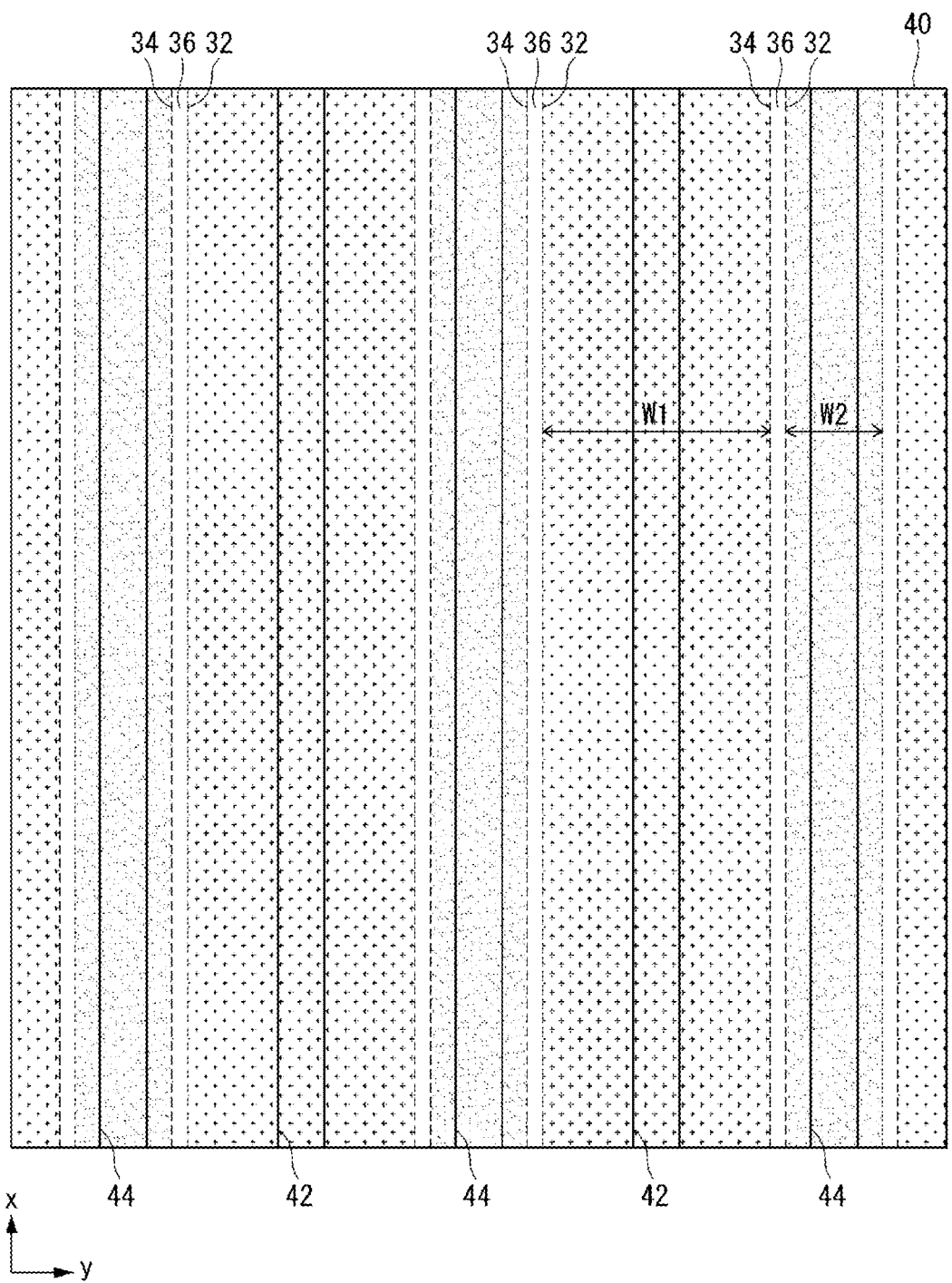
FIG. 2 is a partial rear plan view of the solar cell shown in FIG. 1.

FIG. 1 is a cross-sectional view of a solar cell according to an embodiment of the invention, and FIG. 2 is a partial rear plan view of the solar cell shown in FIG. 1.

Referring to FIGS. 1 and 2, a solar cell 100 according to the embodiment includes a semiconductor substrate 10, a dopant control passivation film (hereinafter, referred to as "control passivation film") 20 on one surface (hereinafter, referred to as "back surface") of the semiconductor substrate 10, a semiconductor layer 30 or conductive regions 32 and 34 on the control passivation film 20, and electrodes 42 and 44 electrically connected to the semiconductor layer 30 or the conductive regions 32 and 34. In this instance, the conductive regions 32 and 34 may include a first conductive region 32 of a first conductive type and a second conductive region 34 of a second conductive type, and the electrodes 42 and 44 may include a first electrode 42 connected to the first conductive region 32 and a second electrode 44 connected to the second conductive region 34. In addition, the solar cell 100 may further include, for example, a front passivation film 24 and an anti-reflection film 26 on a front surface of the semiconductor substrate 10, a back passivation film 40 on the semiconductor layer 30 including the conductive regions 32 and 34, or so on. This will be described in more detail.

The semiconductor substrate 10 may include a base region 110, which includes a first or second conductive dopant at a relatively low doping concentration, and thus is of a first or second conductive type. As an example, the base region 110 may be of the second conductive type. The base region 110 may be formed of a crystalline semiconductor including the first or second conductive dopant. In one example, the base region 110 may be formed of a single crystalline or poly-crystalline semiconductor (e.g. a single crystalline or poly-crystalline silicon) including the first or second conductive dopant. As such, excellent electrical properties can be accomplished based on the base region 110 or the semiconductor substrate 10, which has high crystallinity and thus little defects.

In the embodiment, a front surface field region 130 may be on the front surface of the semiconductor substrate 10. The front surface field region 130 may be formed of a doping area for constituting a part of the semiconductor substrate 10. The front surface field region 130 of the doping area may be of the same conductive type as that of the base region 110 (that is, the first or second conductive type, as an example, the second conductive type), and may have a doping concentration higher than the base region 110.

Also, an anti-reflection structure for minimizing reflection may be formed at the front surface of the semiconductor substrate 10. As an example, a texturing structure having protrusions and/or indentations of a pyramidal shape may be included as the anti-reflection structure. The texturing structure formed on the semiconductor substrate 10 may have a given shape (for example, a pyramidal shape), the outer surface of which is formed along the specific crystalline plane (e.g. (111) plane) of the semiconductor substrate 10. In the instance where the surface roughness is increased by forming protrusions and/or indentation on, for example, the front surface of the semiconductor substrate 10 via texturing, it is possible to reduce the reflectance of light introduced through the front surface of the semiconductor substrate 10, thereby minimizing the loss of light.

In addition, the back surface of the semiconductor substrate 10 may be formed of a relatively smooth flat surface having a lower surface roughness than the front surface via, for example, mirror surface polishing. This is because the properties of the solar cell 100 can considerably vary according to the properties of the back surface of the semiconductor substrate 10 in the instance where both the first and second conductive regions 32 and 34 are formed on the back surface of the semiconductor substrate 10 as in the embodiment. Accordingly, the back surface of the semiconductor substrate 10 is not provided with the protrusions and/or indentations formed by texturing, so as to achieve improved passivation, which may consequently improve the properties of the solar cell 100. However, in some instances, the back surface of the semiconductor substrate 10 may be provided with protrusions and indentations formed by texturing. Various other modifications are possible.

The control passivation film 20 may be formed on the back surface of the semiconductor substrate 10. In one example, the control passivation film 20 may be entirely formed on the back surface of the semiconductor substrate 10 and be in contact with the back surface of the semiconductor substrate 10. Then, the control passivation film 20 can be easily formed without a pattering process, and a structure related to the control passivation film 20 can be simplified and thus carriers can be stably transferred through the control passivation film 20.

The control passivation film 20 positioned between the conductivity region 32 and 34 and the semiconductor substrate 10 may serve as a dopant controller or a diffusion barrier, which prevents the dopant of the conductive regions 32 and 34 from being excessively diffused to the semiconductor substrate 10. The control passivation film 20 may include any of various materials being able to control the dopant diffusion and the transfer of carriers. In one example, the control passivation film 20 may include an oxide, a nitride, a semiconductor, and a conductive polymer.

In the embodiment, by limiting a growth velocity of the semiconductor layer 30 or at least one of the first and second conductive regions 32 and 34 below a certain level, the semiconductor layer 30 or the at least one of the first and second conductive regions 32 and 34 can have desired crystal properties. The desired crystal properties will be described in more detail later. In this instance, a reactivity during the formation of the semiconductor layer 30 may be adjusted by the control passivation film 20, and thus, the adjustment may assist the semiconductor layer 30 or the at least one of the first and second conductive regions 32 and 34 to have the desired crystal properties. That is, if the semiconductor layer 30 is formed to be in contact with the semiconductor substrate 10 without the control passivation film 20, materials for forming the semiconductor layer 30 have a high reactivity with the semiconductor substrate 10 and the growth velocity of the semiconductor layer 30 increases, and thus, it may be difficult to limit the growth velocity below a certain level. Accordingly, in the embodiment, the control passivation film 20 can prevent the semiconductor layer 30 from being in contact with the semiconductor substrate 10 and can decrease the reactivity so that the semiconductor layer 30 can have low crystallinity.

As an example, the control passivation film 20 may be a dielectric film or an insulating film including a dielectric material, which has permittivity over a certain level and thus allows the carriers to be transferred. When the control passivation film 20 has the permittivity over the certain level, the carriers may be easily transferred or penetrated through the control passivation film 20 due to a polarizing phenomenon generated during application of a field. The control passivation film 20 may include an oxide film, a dielectric film or an insulating film including silicon, an oxynitride film, a carboxide film, and so on. As an example, the control passivation film 20 may include a metal oxide film, a silicon oxide film, a silicon oxynitride film, a metal oxynitride film, a silicon carboxide film, and so on. In this instance, a metal included in the metal oxide film or the metal oxynitride film may be aluminum, titanium, hafnium, and so on. In this instance, the control passivation film 20 may include an aluminum oxide film, a titanium oxide film, a hafnium oxide film, an aluminum oxynitride film, a titanium oxynitride film, a hafnium oxynitride film, and so on.

In particular, the control passivation film 20 may be formed of a silicon oxide film, which is formed of a silicon oxide. This is because the silicon oxide film has excellent passivation properties and thus ensures easy transfer of carriers. In addition, the silicon oxide film may be easily formed on a surface of the semiconductor substrate 10 by any of various methods. In this instance, in the embodiment, the control passivation film 20 formed of the silicon oxide film is formed under specific process conditions so that the dopant transfer through the control passivation film 20 can be smoothly performed. The specific process conditions will be described in more detail later. The silicon oxide film formed under the specific process conditions may have chemical formula of $SiO_x$, wherein, x may be 1.1 or more (e.g., 1.1 to 2.0). The silicon oxide film constituting the control passivation film 20 have a refractive index of 1.5 or more (as an example, 1.5 to 1.7). In this instance, the control passivation film 20 formed of the silicon oxide film have a refractive index larger than a refractive index of another insulating film formed of the silicon oxide film (for example, the anti-reflection film 26, or the front and back passivation films 24 and 40). As an example, the another insulating film formed of the silicon oxide film may have a refractive index of 1.4 or more and less than 1.5. However, the embodiments of the invention are not limited thereto. The silicon oxide film used as the control passivation film 20 may have any of various chemical formulas and any of various refractive indexes.

In this instance, the control passivation film 20 may have an amorphous structure. More particularly, the control passivation film 20 may be an amorphous film only consisting of the amorphous structure or an amorphous film including a locally-crystallized portion.

As such, the control passivation film 20 having the amorphous structure may contribute to form the diffusion regions 320 and 340 formed inside the semiconductor substrate 10. More particularly, when the control passivation film 20 has the amorphous structure, the first or second conductive dopant included in the conductive regions 32 and 34 may easily penetrate through the control passivation film 20. Accordingly, the first or second conductive dopant included in the conductive regions 32 and 34 penetrates through the control passivation film 20 and is diffused into an inside of the semiconductor substrate 10, and thus, the diffusion regions 320 and 340 can be easily formed inside the semiconductor substrate 10. Also, the control passivation film 20 may include a first doped portion 202 and/or a second doped portion 204 having the first or second conductive dopant included in the conductive regions 32 and 34. The first doped portion 202 and the second doped portion 204 may have a doping concentration higher than a doping concentration of another insulating film not substantially having the dopant (that is, the anti-reflection film 26, and the front and back passivation films 24 and 40). The diffusion regions 320 and 340 and the doped portion 202 and 204 will be described in more detail later.

In this instance, as stated above, when the control passivation film 20 is formed under the limited process conditions, the first and/or the second doped portion 202 and/or 204, and the diffusion regions 320 and 340 can be easily formed. The limited process conditions will be described in more detail later.

Also, when the control passivation film 20 has the amorphous structure, the crystallinity of the semiconductor layer 30 formed on the control passivation film 20 can be decreased and thus the semiconductor layer 30 can have desired crystal properties. However, the embodiments of the invention are not limited thereto. The desired crystal properties of the semiconductor layer 30, which will be later, may be achieved when the semiconductor layer 30 is formed on the control passivation film 20 not having the amorphous structure. Therefore, the semiconductor layer 30 can have the desired crystal properties when the semiconductor layer 30 is formed under the limited process conditions even in the instance that the semiconductor layer 30 is formed on the control passivation film 20 not having the amorphous structure. Thus, the control passivation film 20 may not have the amorphous structure, and this is included in the embodiments of the invention.

For the carrier transfer and the control of the dopant diffusion through the control passivation film 20, the control passivation film 20 having the amorphous structure may be thin. Accordingly, the control passivation film 20 may be thinner than the other insulating film or layer (the anti-reflection film 26 and/or the front and back passivation films 24 and 40, more particularly, the other insulating film or layer including an oxide film or layer). In one example, the thickness of the control passivation film 20 may be 5 nm or less (more specifically, 2 nm or less, for example, within a range from 0.5 nm to 2 nm). When the thickness of the control passivation film 20 exceeds 5 nm, the carrier transfer may be difficult, and consequently, the solar cell 100 cannot operate. When the thickness of the control passivation film 20 is below 0.5 nm, it may be difficult to form the control passivation film 20 having the desired quality. In order to facilitate the carrier transfer and the dopant diffusion through the control passivation film 20, the thickness of the control passivation film 20 may be 2 nm or less (more specifically, within a range from 0.5 nm to 2 nm). At this time, in order to facilitate an increase in the carrier transfer and the dopant diffusion through the control passivation film 20, the thickness of the control passivation film 20 may be within a range from 0.5 nm to 1.5 nm. However, the embodiments of the invention are not limited thereto, and the thickness of the control passivation film 20 may have any of various values.

The semiconductor layer 30 including the conductive regions 32 and 34 may be disposed on the control passivation film 20. In the embodiment, the first and the second conductive regions 32 and 34 are formed of the semiconductor layer 30 disposed on the semiconductor substrate 10 (more particularly, on the control passivation film 20) to be separated from the semiconductor substrate 10 and doped with the first or second conductive dopant. As an example, the semiconductor layer 30 (or the first and the second conductive regions 32 and 34) may be in contact with the control passivation film 20, and then, the carriers may be easily transferred through the control passivation film 20 and the structure may be simplified.

In the embodiment, the semiconductor layer 30 is spaced apart from the semiconductor substrate 10 and is formed by a process separated from a process of the semiconductor substrate 10, and thus, the semiconductor layer 30 has a crystal structure of crystallinity different from that of the semiconductor substrate 10. As an example, the semiconductor layer 30 may include a poly-crystalline portion 302 having a poly-crystalline structure with a relatively small grain size. This is because the semiconductor layer 30 is formed under specific film-formation conditions so that the semiconductor layer 30 can have desired crystal properties. In this instance, as stated above, when the control passivation film 20 has the amorphous structure, this contributes to control of the crystallinity of the semiconductor layer 30. A method for manufacturing the semiconductor layer 30 will be described in more detail later.

More particularly, the semiconductor layer 30 may include the poly-crystalline portion 302 having a poly-crystalline structure with a nanometer-sized grain (that is, 1 nm or more and less than 1 um). The grain size may be based on an average size. In this instance, the grain size may be measured or evaluated by using a transmission electron microscopy (TEM). As an example, the semiconductor layer 30 may be formed of the poly-crystalline portion 302 with the grain size of 300 nm or less (as an example, 1 nm to 300 nm). Or, the grain size of the semiconductor layer 30 is the same as or less than a thickness of the semiconductor layer 30. As such, when the grain size of the semiconductor layer 30 is 300 nm or less or is less than the thickness of the semiconductor layer 30, the effect by the poly-crystalline portion 302 can be largely enhanced. For reference, the thickness of the semiconductor layer 30 may be 100 nm to 500 nm (as an example, 150 nm to 500 nm). In this thickness range, the semiconductor layer 30 can perform its function and the process time for forming the semiconductor layer 30 can be minimized. However, the embodiments of the invention are not limited thereto.

In addition, in the semiconductor layer 30 formed of the poly-crystalline portion 302 having the poly-crystalline structure with the relatively small grain size, the variation of the crystallinity of the semiconductor layer 30 may be minimized even though the temperature of the semiconductor layer 30 is changed. Meanwhile, during the forming of the solar cell 100, a heat-treatment process at a high temperature is performed for hydrogen passivation before or after forming the electrodes 42 and 44. If the crystallinity of the semiconductor layer 30 is large (that is, the grain size is lager, a deep trap site as an example, (111) surfaces) may be largely induced during the heat-treatment process at the high temperature. Hydrogen penetrates through a trap site. However, if the hydrogen reaches the deep trap site, the hydrogen is trapped and remained at the deep trap site. Thus, the hydrogen may not sufficiently penetrate, and thus, the hydrogen passivation may be not sufficient. Considering this, in the embodiment, the formation of the deep trap site decreases by decreasing the grain size of the semiconductor layer 30, and thus, the hydrogen can sufficiently penetrate, and the effect of the hydrogen passivation can be maximized.

Accordingly, the semiconductor layer 30 has enhanced passivation property even though the heat-treatment process at the high temperature is performed after forming the semiconductor layer 30. Accordingly, the solar cell 100 can have a high implied open-circuit voltage (Voc), regardless of existence or not of the heat-treatment process at the high temperature.

On the other hand, if the semiconductor layer 30 has the micrometer-sized grain (that is, 1 um or more), the deep trap site may be easily formed and it may hinder the hydrogen penetration.

In the embodiment, the semiconductor layer 30 includes the poly-crystalline portion 302, and may further include an amorphous portion 304 having an amorphous structure. When the semiconductor layer 30 includes both of the poly-crystalline portion 302 with the relatively small grain size and the amorphous portion 304, the effect due to the small grain size or the low crystallinity can be enhanced even more. As an example, the poly-crystalline portion 302 and the amorphous portion 304 of the semiconductor layer 30 may be distinguished by a transmission electron microscopy, X-ray diffraction (XRD) spectrometer, Raman spectroscopy, and so on.

More particularly, the semiconductor layer 30 need not include the amorphous portion 304, or may include the poly-crystalline portion 302 more than the amorphous portion 304. An amount or a ratio of the amorphous portion 304 in a final structure of the solar cell 100 may be small because an amount or a ratio of the amorphous portion 304 may be decreased by an additional heat-treatment applied to the semiconductor layer 30 during a doping process (for example, a laser irradiation during a laser doping). As an example, in the semiconductor layer 30, the amount of the poly-crystalline portion 302 may be 60 to 100 vol %, and the amorphous portion 304 may be 0 to 40 vol %. However, the embodiments of the invention are not limited thereto. Further, in the embodiment, the semiconductor layer 30 may be formed of the amorphous structure and/or micro-crystalline structure, and other modifications are possible.

In the embodiment, the semiconductor layer 30 includes the first conductive region 32 having the first conductive type dopant to have the first conductive type and the second conductive region 34 having the second conductive type dopant to have the second conductive type. In this instance, a region having the conductive type the same as that of the base region 110 between the first and second conductive regions 32 and 34 (as an example, the second conductive region 34) has a doping concentration higher than a doping concentration of the base region 110. The first conductive region 32 and the second conductive region 34 may be positioned together in the semiconductor layer 30 continuously formed on the control passivation film 20 and thus may be in the same plane. In addition, the barrier region 36 may be located between the first conductive region 32 and the second conductive region 34 in the same plane as that of the first and second conductive regions 32 and 34.

One region having the conductive type opposite to that of the base region 110 between the first and second conductive regions 32 and 34 constitutes a part of an emitter region. The emitter region forms a pn junction (or a pn tunnel junction) along with the base region 110 and thus produces carriers via photoelectric conversion. The other region having the conductive type the same as that of the base region 110 between the first and second conductive regions 32 and 34 constitutes a part of a back surface field region. The back surface field region forms a back surface field so as to prevent the loss of carriers due to recombination on the back surface of the semiconductor substrate 10.

The first or second conductive type dopant included in the semiconductor layer 30 may be included in the semiconductor layer 30 in the process of forming the semiconductor layer 30, or may be included in the semiconductor layer 30 after the semiconductor layer 30 is formed through various doping methods such as, for example, a thermal diffusion and an ion implantation. In this instance, various materials to allow the semiconductor layer 30 has an n-type or a p-type may be used as the first or second conductive type dopant. When the first or second conductive type dopant is of the p-type, the dopant may be selected from among group III elements such as, for example, boron (B), aluminum (Al), gallium (Ga), and indium (In). When the first or second conductive type dopant is of the n-type, the dopant may be selected from among group V elements such as, for example, phosphorus (P), arsenic (As), bismuth (Bi), and antimony (Sb). As an example, one of the first and second conductive type dopants may be boron (B) and the other of the first and second conductive type dopants may be phosphorus (P).

In addition, the barrier region 36 is located between the first conductive region 32 and the second conductive region 34 so that the first conductive region 32 and the second conductive region 34 are spaced apart from each other by the barrier region 36. When the first conductive regions 32 and the second conductive regions 34 come into contact with each other, shunt may occur, which causes deterioration in the performance of the solar cell 100. Accordingly, in the embodiment, the barrier region 36 may be located between the first conductive region 32 and the second conductive region 34 so as to prevent unnecessary shunt.

The barrier region 36 may be formed of, for example, an undoped insulation material (e.g. an oxide or a nitride). Alternatively, the barrier region 36 may include an intrinsic semiconductor. In this instance, the first conductive regions 32, the second conductive regions 34, and the barrier regions 36 are formed of the same semiconductors (e.g. the semiconductor layer 30 including the poly-crystalline portion 302), so as to be successively formed and to come into contact at side surfaces thereof with one another, and the barrier region 36 may be formed of an i-type (intrinsic) semiconductor, which substantially includes no dopant. As an example, when an intrinsic semiconductor layer is formed, and then a portion of the intrinsic semiconductor layer is doped with a first conductive type dopant so as to form the first conductive regions 32 and a portion of the remaining intrinsic semiconductor layer is doped with a second conductive type dopant so as to form the second conductive regions 34, the resulting remaining portion at which the first conductive regions 32 and the second conductive regions 34 are not formed may constitute the barrier regions 36. In this way, the formation of the first conductive regions 34, the second conductive regions 34 and the barrier region 36 may be simplified.

However, the embodiments of the invention are not limited thereto. Therefore, the barrier region 36 may be formed by any of various methods, and thus, have any of various thicknesses and any of various shapes. The barrier region 36 may be formed as an empty space (e.g., a trench). Various other modifications are possible. Also, it is by example that the barrier region 36 is formed so as to partially separate the first and second conductive type regions 32 and 34 from each other in FIG. 2. However, the barrier region 36 may be formed so as to partially separate the first and second conductive type regions 32 and 34 at an interface therebetween from each other. In addition, the barrier region 36 may not be necessarily formed, and the interfaces of first and second conductive type regions 32 and 34 may entirely be in contact with each other.

In the above descriptions, the first and second conductive regions 32 and 34 or the semiconductor layer 30 constituting the same includes the poly-crystalline portion 302 and may further include the amorphous portion 304 by example. However, the embodiments of the invention are not limited thereto. Therefore, the first and second conductive regions 32 and 34 or the semiconductor layer 30 constituting the same may have a crystal structure different from the semiconductor substrate 10 so as to be easily formed on the semiconductor substrate 10. For example, the first and second conductive type regions 32 and 34 may be formed by doping an amorphous semiconductor, a micro-crystalline semiconductor or a poly-crystalline semiconductor (e.g., amorphous silicon, micro-crystalline silicon, or poly-crystalline silicon) that may be easily manufactured by various methods such as deposition and the like, with a first or second conductive type dopant. More particularly, when the first and second conductive regions 32 and 34 may have the poly-crystalline semiconductor, the carrier mobility may be high.

In this instance, in the embodiment, the diffusion regions 320 and 340 may be formed at the semiconductor substrate 10. The diffusion regions 320 and 340 may constitute a part of the semiconductor substrate 10. Thus, the diffusion regions 320 and 340 may have a crystalline structure the same as that of the base region 110, and may have a conductive type or a doping concentration different from that of the base region 110.

The diffusion regions 320 and 340 may include one of a first diffusion region 320 and a second diffusion region 340, or may include both of the first diffusion region 320 and the second diffusion region 340. Here, the first diffusion region may be locally formed to correspond to the first conductive region 32 at a portion of the semiconductor substrate 10 adjacent to the control passivation film 20. A doping concentration of the first conductive type dopant in the first diffusion region 320 may be lower than a doping concentration of the first conductive type dopant in the first conductive region 32. The second diffusion region 340 may be locally formed to correspond to the second conductive region 34 at a portion of the semiconductor substrate 10 adjacent to the control passivation film 20. A doping concentration of the second conductive type dopant in the second diffusion region 340 may be lower than a doping concentration of the second conductive type dopant in the second conductive region 34. In this instance, a region having the conductive type the same as that of the base region 110 between the first and second diffusion regions 320 and 340 (as an example, the second diffusion region 343) has a doping concentration higher than a doping concentration of the base region 110. Hereinafter, the base region 110 has the second conductive type for convenience, by example. In the solar cell 100 having a back contact structure as in the above, both of the first and second conductive regions 32 and 34 are positioned on the back surface, and thus, the diffusion regions 320 and 340 may prohibit necessary carrier transfer if the diffusion regions 320 and 340 are entirely formed on the back surface of the semiconductor substrate 10. For example, if the first diffusion region 320 is entirely formed, the first diffusion region 320 hinders the carrier transfer toward the second conductive region 34 at a portion adjacent to the second conductive region 34. Or, if the second diffusion region 340 is entirely formed, the second diffusion region 340 hinders the carrier transfer toward the first conductive region 32 at a portion adjacent to the first conductive region 32. More particularly, the first diffusion region 320 and the second diffusion region 340 are spaced apart from each other and the base region 110 is positioned between the first diffusion region 320 and the second diffusion region 340 to separate them. Then, the doping region due to the first and second diffusion regions 320 and 340 can be reduced, and thus, the variation of the properties of the semiconductor substrate 10 can be minimized.

Also, the first and second diffusion regions 320 and 340 have a shape corresponding to the first and second conductive regions 32 and 34, and thus, the first diffusion regions 32 and the second diffusion regions 34 may be alternatively arranged.

In the embodiment, the diffusion regions 320 and 340 transform or change an energy band at a portion where the first or second conductive region 32 or 34, the control passivation film 20, and the semiconductor substrate 10 are adjacent so that majority carriers can be transferred to the first or second conductive region 32 or 34. Thereby, open-circuit voltage and fill factor can be enhanced, and, more particularly, the fill factor can be largely enhanced. This will be described in more detail with reference to FIG. 3.

Figure 3:
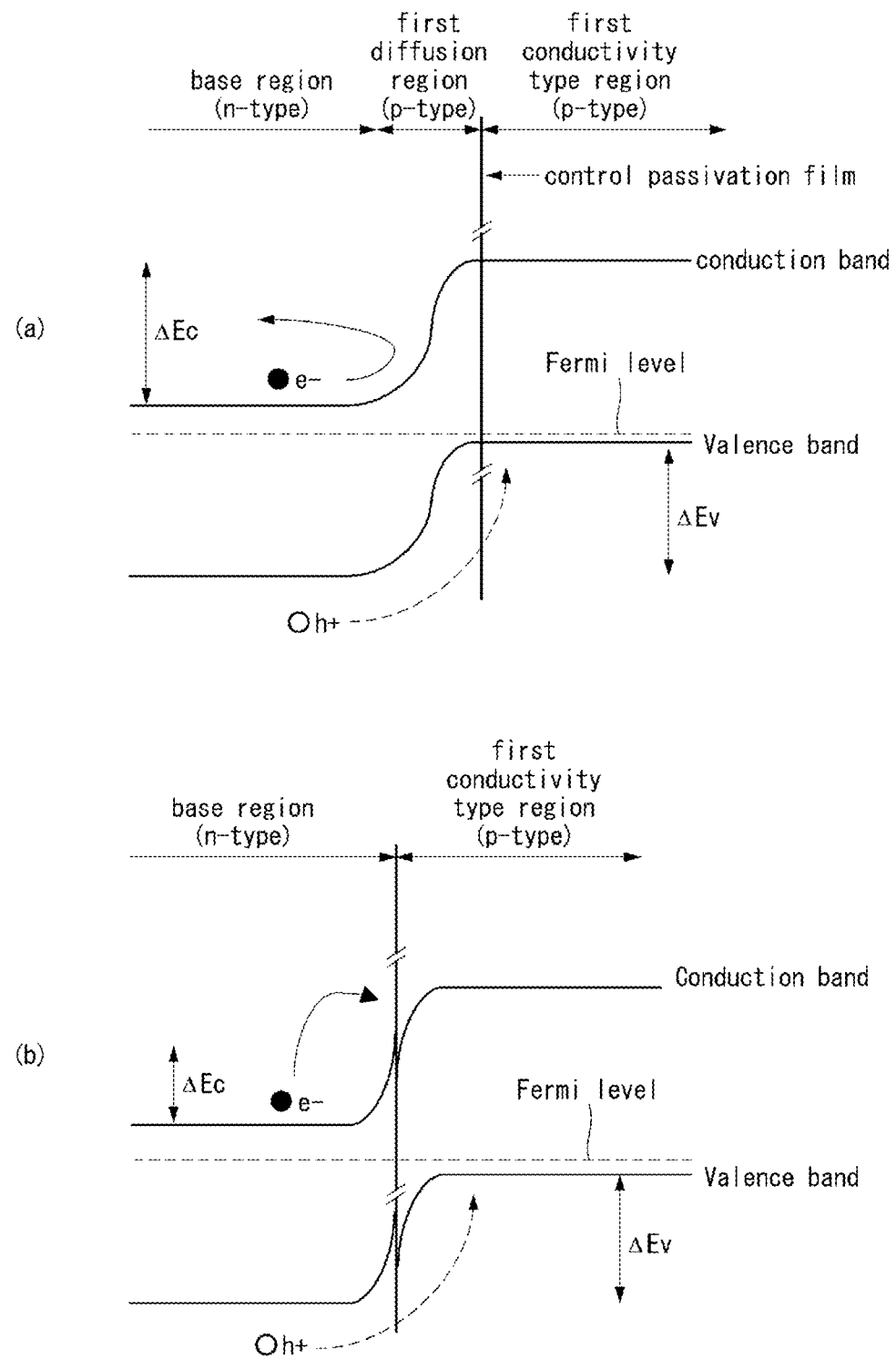
FIG. 3 shows an energy band diagram in a solar cell according to an embodiment of the invention in (a) and an energy band diagram in the conventional solar cell not including a diffusion region in (b).

FIG. 3 shows an energy band diagram in the solar cell 100 according to the embodiment in (a) and an energy band diagram in the conventional solar cell not including the diffusion regions 320 and 340. In FIG. 3, as an example, it is shown that the base region 110 is of the n-type, and the first diffusion region 320 and the first conductive region 32 are of p-type. For reference, a doping concentration of the first diffusion region 320 is lower than a doping concentration of the first conductive region 32.

Referring to (a) of FIG. 3, the first diffusion region 320 changes the energy band so that each of a conduction band and a valence band gradually and continuously decreases from the first conductive region 32 to the base region 10 via the control passivation film 20. According to the energy band diagram, electron (e−) at the conduction band cannot be transferred to the first conductive region 32 due to an energy band gap (ΔEc) between the base region 10 and the first conductive region 32, as shown in a line arrow of FIG. 3. On the other hand, hole (h+) at the valence band can be easily transferred to the first conductive region 32 due to an energy band gap (ΔEv) between the base region 10 and the first conductive region 32, as shown in a dotted line arrow of FIG. 3. On the other hand, if the first diffusion region 320 is not included, as shown in (b) of FIG. 3, the conduction band and the valence band are not continuous around the control passivation film 20, and thus, discontinuous band may prevent the necessary carrier transfer. That is, the discontinuous conduction and valence bands around the control passivation film 22 may be an energy barrier for preventing the carrier, which should be transferred to the conductive regions 32 and 34, from being transferred to the conductive regions 32 and 34. As such, in the embodiment, the diffusion regions 320 and 340 change the energy band so that the necessary carrier can be easily transferred to the first and second conductive regions 32 and 34, and thus, the open-circuit voltage and the fill factor of the solar cell 100 can be enhanced.

Also, the control passivation film 20 may include a first doped portion 202 and/or a second doped portion 204. The first doped portion 202 is locally positioned between the first conductive region 32 and the first diffusion region 320 and has the first conductive type dopant. The second doped portion 204 is locally positioned between the second conductive region 34 and the second diffusion region 340 and has the second conductive type dopant. That is, the control passivation film 20 include the first and second doped portions 202 and 204, each locally formed to correspond to the first and second conductive regions 32 and 34, respectively. In the embodiment, as an example, in the control passivation film 20, the first and second doped portions 202 and 204 are spaced apart from each other and are alternatively arranged. An undoped portion 206, which does not have a dopant and is formed to correspond to the barrier region 36, is positioned between the first and second doped portions 202 and 204. However, the embodiments of the invention are not limited thereto. In this instance, highly doped portions 202a and 204a may be locally or partially formed at the first and the second doped portion. The dopant is concentrated at the highly doped portions 202a and 204a more than the other portion, and thus, has a doping concentration higher than a doping concentration of the other portion of the first or second doped portion 202 or 204. The highly doped portion 202a and 204a may be a portion where the dopant is aggregated and remained at a part of the control passivation film 20. The highly doped portion 202a and 204a may have any of various and random shapes and may be non-uniformly arranged.

Accordingly, the first and second doped portions 202 and 204 of the control passivation film 20 has a doping concentration of the first or second conductive type dopant higher than a doping concentration in the other undoped insulating film (the anti-reflection film 26, and the front and back passivation films 24 and 40, more particularly, the other insulating film including an oxide film).

The diffusion regions 320 and 340 are formed by the first or second conductive type dopant, which was included in the conductive regions 32 and 34, penetrated through the control passivation film 20. When the control passivation film 20 has the amorphous structure, the dopant can easily penetrate the control passivation film 20 and thus the diffusion regions 320 and 340 can be formed. Thereby, the solar cell has a specific doping profile, and this will be described in detail with reference to FIG. 4 along with FIGS. 1 and 2.

Figure 4:
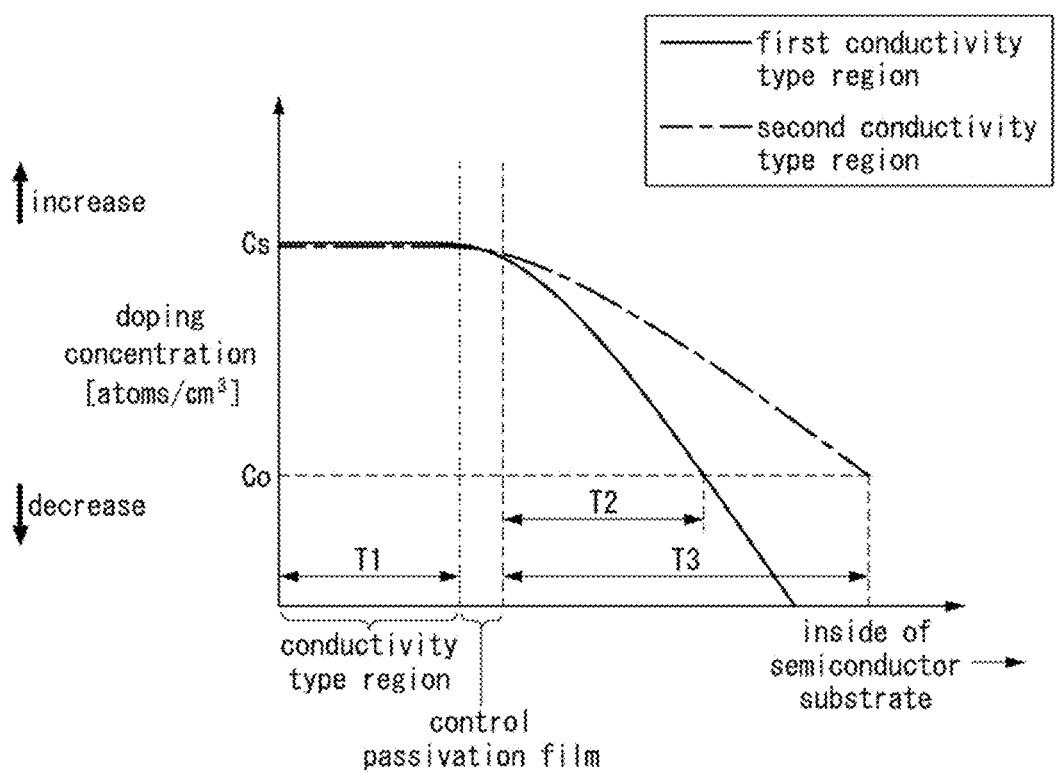
FIG. 4 is a graph of a doping profile in a conductive region, a control passivation film, and a diffusion region included in the solar cell shown in FIG. 1.

FIG. 4 is a graph of a doping profile in a conductive region, a control passivation film, and a diffusion region included in the solar cell shown in FIG. 1. For reference, the doping profile shown in FIG. 4 illustrates a result measured by a secondary ion mass spectrometry.

As shown in FIG. 4, when the first conductive region 32, the control passivation film 20, and the first diffusion region 320, and/or the second conductive region 34 is present, the control passivation film 20, and the second diffusion region 340 are viewed in a thickness direction thereof, a relatively uniform doping concentration in the first or the second conductive region 32 or 34 is present, and the doping concentration is continuously and gradually decreased from the control passivation film 20 and the first or second diffusion region 320 or 340 to an inside of the semiconductor substrate 10. That is, the first conductive region 32 has a relatively uniform and relatively high surface doping concentration Cs, and the doping concentration is continuously and gradually decreased from the control passivation film 20 and the first diffusion region 320 to the inside of the semiconductor substrate 10. Also, the second conductive region 34 has a relatively uniform and relatively high surface doping concentration Cs, and the doping concentration is continuously and gradually decreased from the control passivation film 20 and the second diffusion region 340 to the inside of the semiconductor substrate 10. For convenience, the surface doping concentration Cs of the first conductive region 32 and the surface doping concentration Cs of the second conductive region 34 are the same in FIG. 4, by example. Actually, the surface doping concentration Cs of the first conductive region 32 may be different from the surface doping concentration Cs of the second conductive region 34. By this doping profile, it can be seen that the first and second diffusion regions 320 and 340 are formed by the first and/or the second conductive type dopant, which is included in the conductive region 32 or 34, penetrated through the control passivation film 20, and is diffused into the semiconductor substrate 10.

When viewed in the thickness direction, a variation of the doping concentration of the first diffusion region 320 (that is, a difference between the doping concentration of a portion of the first diffusion region 320 adjacent to the control passivation film 20 and the doping concentration of an opposition portion of the first diffusion region 320) may be larger than a variation of the doping concentration of the first conductive region 32 (that is, a difference between the doping concentration of a portion of the first conductive region 32 adjacent to the control passivation film 20 and the doping concentration of an opposition portion of the first conductive region 32). Similarly, a variation of the doping concentration of the second diffusion region 340 (that is, a difference between the doping concentration of a portion of the second diffusion region 340 adjacent to the control passivation film 20 and the doping concentration of an opposition portion of the second diffusion region 340) may be larger than a variation of the doping concentration of the second conductive region 34 (that is, a difference between the doping concentration of a portion of the second conductive region 34 adjacent to the control passivation film 20 and the doping concentration of an opposition portion of the second conductive region 34). Accordingly, an absolute value of a doping concentration gradient (or slope) in the first diffusion region 320 is larger than an absolute value of a doping concentration gradient in the first conductive region 32. An absolute value of a doping concentration gradient (or slope) in the second diffusion region 340 is larger than an absolute value of a doping concentration gradient in the first conductive region 34. Since the first or second conductive type dopant is supplied from the first or second conductive region 32 or 34, the dopant is uniformly dispersed in each of the first and the second conductive regions 32 and 34. On the other hand, the first and second diffusion regions 320 and 340 are formed by the first and/or the second conductive type dopant, which is included in the conductive region 32 or 34, penetrated through the control passivation film 20, and is diffused into the semiconductor substrate 10.

As an example, the doping concentrations of the first and second conductive regions 32 and 34 may be $1\times10^{19}/cm^3$ or more. Within this range, the effect by the first and second conductive regions 32 and 34 can be sufficiently achieved, and the contact resistance with the first and second electrodes 42 and 44 can be minimized. Also, as an example, the doping concentration of the first diffusion region 320 may be $1\times10^{19}/cm^3$ or less and may be smaller than the doping concentration of the first conductive region 32, and the doping concentration of the second diffusion region 340 may be $1\times10^{19}/cm^3$ or less and may be smaller than the doping concentration of the second conductive region 34. However, the embodiments of the invention are not limited thereto. In this instance, each of the first and the second conductive regions 32 and 34 may have a relatively uniform doping concentration in an entire portion.

The thickness T2 or T3 of the diffusion regions 320 or 340 may be the same as or larger than the thickness T1 of the conductive region 32 or 34 (or thickness T1 of the semiconductor layer 30). More particularly, the thickness T2 of the first diffusion regions 320 may be the same as or larger than the thickness T1 of the first conductive region 32 or the semiconductor layer 30, and the thickness T3 of the second diffusion regions 340 may be the same as or larger than the thickness T1 of the second conductive region 34 or the semiconductor layer 30. According to this, the process time for forming the semiconductor layer 30 can be reduced, and the effects by the first and second diffusion regions 320 and 340 can be sufficiently achieved. However, the embodiments of the invention are not limited thereto. The thickness T2 or T3 of the diffusion region 320 or 340 may be smaller than the thickness T1 of the conductive region 32 or 34 (or the thickness T1 of the semiconductor layer 30.

As an example, the thickness T2 or T3 of the first or second diffusion region 320 or 340 may be defined a distance from the surface of the semiconductor substrate 10 to a position having a reference doping concentration Co. The reference doping concentration Co is regarded as a doping concentration of a portion substantially not-doped. For example, when the doping concentrations of the first and second conductive regions 32 and 34 and the first and second diffusion regions 320 and 340 are measured by the secondary ion mass spectrometry as in the above, the reference doping concentration Co may be $1\times10^{15}/cm^3$ or $1\times10^{17}/cm^3$ (particularly, $1\times10^{15}/cm^3$). This is because a doping concentration may be measured due to noise even in the undoped portion when the doping concentration is measured by the secondary ion mass spectrometry. That is, if the doping concentration is less $1\times10^{15}/cm^3$ or $1\times10^{17}/cm^3$, the portion is actually not doped and thus the portion is not considered to define the thickness of the first or second diffusion region 320 or 340. However, the embodiments of the invention are not limited thereto. Therefore, the doping concentrations of the first and second diffusion regions 320 and 340 may be measured by any of various methods, and the thicknesses of the first or second diffusion region 320 or 340 may be measured or evaluated according to the method.

As an example, when views in a thickness direction, an absolute value of a doping concentration gradient in the second diffusion region 340 is smaller than an absolute value of a doping concentration gradient in the first diffusion region 320. Also, the thickness T3 of the second diffusion region 340 having the second conductive type the same as that of the base region 110 may be larger than the thickness T2 of the first diffusion region 320 having the first conductive type opposite to that of the base region 110. If the second diffusion region 340 having the second conductive type the same as that of the base region 110 may be relatively thick, this may not affect the property of the base region 110 or the semiconductor substrate 10. On the other hand, if the first diffusion region 320 having the first conductive type opposite to that of the base region 110 may be relatively thick, this may deteriorate the passivation property. As an example, in order to simplify the process, the second conductive region 34 and the front surface field region 130 may be simultaneously formed by a thermal diffusion. Then, since the second conductive type dopant is infinite, the second diffusion region 340 being relatively thick can be easily formed. Also, the first conductive region 32 may be formed by a laser doping for a partial doping. Then, since the first conductive type dopant is finite, the first diffusion region 320 being relatively thin can be easily formed. However, the embodiments of the invention are not limited thereto. The thickness T3 of the second diffusion region 340 may be smaller than the thickness T2 of the first diffusion region 320.

Or, the thickness T2 of the first diffusion region 320 may be 500 nm or less (as an example, 50 nm to 500 nm), and the thickness T3 of the second diffusion region 340 may be 800 nm or less (50 nm to 800 nm). Within the thickness range, the effect by the first and second diffusion regions 320 and 340 can be effectively achieved. However, the embodiments of the invention are not limited thereto.

In the drawings and the above embodiment, both of the first diffusion region 320 and the second diffusion region 340 are included, by example. Unlike this, at least one of the first diffusion region 320 and the second diffusion region 340 may be included. As an example, between the first and second diffusion regions 320 and 340, the first diffusion region 320 corresponding to a region having the conductive type opposite to that of the semiconductor substrate 10 between the first and second conductive regions 32 and 34 (as an example, the first conductive region 32) may be included, but the second diffusion region 340 corresponding to a region having the conductive type the same as that of the semiconductor substrate 10 between the first and second conductive regions 32 and 34 (as an example, the second conductive region 34) may be not included. With the conductive type region using the carrier by the dopant having the conductive type the same as the dopant included in the semiconductor substrate 10 as the majority carrier, the carriers of the semiconductor substrate 10 are accumulated and thus the carrier are easily transferred through the control passivation film 20 by the field induced due to the accumulated carriers. On the other hand, with the conductive type region using the carrier by the dopant having the conductive type opposite to that of the dopant included in the semiconductor substrate 10 as the majority carrier, it may be difficult for the carriers to penetrate the control passivation film 20. In another embodiments, only the second diffusion region 340 may be included, but the first diffusion region 320 may be not included. Also, in other embodiment, both of the first and second diffusion regions 320 and 340 may be not included.

The back passivation film 40 may be formed on the first and second conductive regions 32 and 34 and the barrier region 36 at the back surface of the semiconductor substrate 10. As an example, the back passivation film 40 may be in contact with the first and second conductive regions 32 and 34 and the barrier region 36 so as to achieve a simplified configuration.

The back passivation film 40 includes contact holes 46 for the electrical connection of the conductive regions 32 and 34 and the electrodes 42 and 44. The contact holes 46 include a first contact hole 461 for the connection of the first conductive region 32 and the first electrode 42, and a second contact hole 462 for the connection of the second conductive region 34 and the second electrode 44. As such, the back passivation film 40 serves to prevent the first conductive regions 32 and the second conductive regions 34 from being connected to incorrect electrodes (i.e. the second electrode 44 in the instance of the first conductive regions 32 and the first electrode 42 in the instance of the second conductive regions 34). In addition, the back passivation film 40 may have the passivation effects of the first and second conductive regions 32 and 34 and/or the barrier region 36.

Also, the front passivation film 24 and/or the anti-reflection film 26 may be disposed on the front surface of the semiconductor substrate 10 (more accurately, on the front surface field region 130 formed on the front surface of the semiconductor substrate 10). However, the embodiments of the invention are not limited thereto. Accordingly, an insulating film having a different stacked structure is formed on the front surface field region 130.

The front passivation film 24 and the anti-reflection film 26 may be disposed on an entire portion of the front surface of the semiconductor substrate 10. Also, the back passivation film 40 may be disposed on an entire portion of the back surface of the semiconductor layer 30 except for the contact holes 46.

The front passivation film 24 or the back passivation film 40 is in contact with the semiconductor substrate 10 or the semiconductor layer 30, thereby causing the passivation of defects in a bulk or the surface of the semiconductor substrate 10 or the semiconductor layer 30. As such, it is possible to increase an open-circuit voltage of the solar cell 100 by removing recombination sites of minority carriers. The anti-reflection film 26 reduces the reflectance of light introduced into the front surface of the semiconductor substrate 10. Thereby, the quantity of light, which reaches the pn junction may be increased. This may increase a short-circuit current Isc of the solar cell 100.

The front passivation film 24, the anti-reflection film 26, and the back passivation film 40 may be formed of various materials. As an example, the front passivation film 24, the anti-reflection film 26, or the back passivation film 40 may be a single film, or a multilayered film having the form of a combination of two or more films, selected from among the group of a silicon nitride film, a silicon nitride film containing hydrogen, a silicon oxide film, a silicon oxynitride film, an aluminum oxide film, a silicon carbide film, $MgF_2$, ZnS, $TiO_2$ and $CeO_2$.

As an example, in the embodiment, the front passivation film 24 and/or the anti-reflection film 26, and the back passivation film 40 may include no dopant, in order to achieve excellent insulation and passivation properties. However, the embodiments of the invention are not limited thereto.

Each of the front passivation film 24, the anti-reflection film 26, and back passivation film 40 may be thicker than the control passivation film 20. Then, the insulating property and the passivation property thereof can be enhanced. Various modifications are possible.

The first electrode 42 fills at least a part of the first contact hole 461 of the back passivation film 40 and thus is electrically connected to (as an example, is in contact with) the first conductive region 32. Similarly, the second electrode 44 fills at least a part of the second contact hole 462 of the back passivation film 40 and thus is electrically connected to (as an example, is in contact with) the second conductive region 34.

Hereinafter, one example of a plan shape of the first conductive regions 32, the second conductive regions 34, the barrier regions 36, and the first and second electrodes 42 and 44 will be described in detail with reference to FIGS. 1 and 2.

Referring to FIGS. 1 and 2, in the embodiment, the first conductive regions 32 and the second conductive regions 34 have an elongated shape so as to form stripes respectively, and are alternately arranged in the direction crossing the longitudinal direction thereof. The barrier region 36 may be located between the first conductive regions 32 and the second conductive regions 34 so that the first and second conductive regions 32 and 34 are spaced apart from each other by the barrier region 36. Although not illustrated in FIGS. 1 and 2, a plurality of first conductive regions 32, which are spaced apart from one another, may be connected to one another at one edge, and a plurality of second conductive regions 34, which are spaced apart from one another, may be connected to one another at an opposite edge. However, the embodiments of the invention are not limited thereto.

In this instance, when the base region 110 is of the second conductive type, an area of the first conductive regions 32 may be larger than an area of the second conductive regions 34. As an example, the second conductive region 34 and the base region 110 are of an n-type, the first conductive regions 32 may be widely formed. In this instance, the first conductive regions 32 forms a junction along with the base region 110 (e.g. a pn junction with the control passivation film 20 interposed therebetween), which produces carriers via photoelectric conversion. Thus, by increasing the area of the first conductive regions 32, a photoelectric conversion area can be increased. Also, in this instance, the emitter region, which has a wide area, may effectively collect holes, which move relatively slowly, thereby contributing to further improvement in photoelectric conversion efficiency. However, the embodiments of the invention are not limited thereto.

As an example, the areas of the first conductive regions 32 and the second conductive regions 34 may be adjusted by providing the first and second conductive regions 32 and 34 with different widths. That is, the width W1 of the first conductive regions 32 may be greater than the width W2 of the second conductive regions 34.

In addition, the first electrodes 42 may have a stripe shape so as to correspond to the first conductive regions 32, and the second electrodes 44 may have a stripe shape so as to correspond to the second conductive regions 34. Various other alterations are possible. The contact hole 46 has a shape of connecting a part of the first and the second electrodes 42 and 44 to the first conductive region 32 and the second conductive region 34, respectively. For example, the contact hole 46 may include a plurality of contact holes 46 corresponding to each one of the first and second electrodes 42 and 44. Selectively, the contact hole 46 may be formed at an entire length of each one of the first and second electrodes 42 and 44. According to this, a contact area between the first and second electrodes 42 and 44 and the first and second conductive regions 32 and 34 can be maximized and thus carrier collection efficiency can be enhanced. The other modifications are possible. In addition, although not illustrated in FIGS. 1 and 2, a plurality of first electrodes 42 may be connected to one another at one end, and a plurality of second electrodes may be connected to one another at an opposite edge. However, the embodiments of the invention are not limited thereto.

When light is introduced to the solar cell 100 in the embodiment, electrons and holes are produced via photoelectric conversion at the pn junction, and the produced electrons and holes move to the first conductive regions 32 and the second conductive regions 34 by penetrating through the control passivation film 20, and thereafter move to the first and second electrodes 42 and 44. In this way, electrical energy is produced.

According to the embodiment, the solar cell 100 has a back contact structure where the electrodes 42 and 44 are formed on the back surface of the semiconductor substrate 10 and no electrodes are formed on the front surface of the semiconductor substrate 10, and thus, shading loss can be minimized on the front surface of the semiconductor substrate 10. Thereby, the efficiency of the solar cell 100 may be improved. However, the embodiments of the invention are not limited thereto. Solar cells 100 having different structures will be described in more detail with reference to FIG. 6 and FIG. 7.

In addition, because the first and second conductive regions 32 and 34 are formed over the semiconductor substrate 10 with the control passivation film 20 interposed therebetween, the first and second conductive regions 32 and 34 are configured as a layer separate from the semiconductor substrate 10. As such, light loss due to recombination may be minimized compared to the instance where a doping area, formed by doping the semiconductor substrate 10 with a dopant, is used as conductive regions. In this instance, open-circuit voltage and fill factor of the solar cell 100 can be improved and thus efficiency of the solar cell 100 can be enhanced due to the diffusion regions 320 and 340.

In this instance, because the control passivation film 20 has the amorphous structure, the diffusion regions 320 and 340 can be easily formed at the inside of the semiconductor substrate 10 to correspond to the conductive regions 32 and 34. Thus, open-circuit voltage and fill factor of the solar cell 100 can be improved and thus efficiency of the solar cell 100 can be enhanced due to the diffusion regions 320 and 340.

Also, the semiconductor layer 30 or the conductive regions 32 and 34 include the poly-crystalline portion 302 having the small grain size, the variation of the crystallinity of the semiconductor layer 30 may be prevented or decreased even after heat-treatment process at high-temperature and thus the passivation property may be high. Accordingly, open-circuit voltage may be enhanced, and thus, efficiency of the solar cell may be largely enhanced.

The above control passivation film 20 and semiconductor layer 30 may have the above properties by forming specific method or specific process conditions. Hereinafter, a method for manufacturing a solar cell 100, which forms a control passivation film 20 and the semiconductor layer 30 to have desired properties, will be described in detail with reference to FIGS. 5A to 5F.

FIGS. 5A to 5F are cross-sectional views of a method for manufacturing a solar cell according to an embodiment of the invention.

Figure 5A:
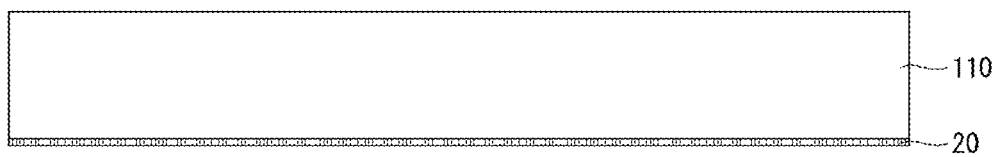
FIGS. 5A to 5F are cross-sectional views of a method for manufacturing a solar cell according to an embodiment of the invention.

First, as illustrated in FIG. 5A, a control passivation film 20 is formed on the back surface of a semiconductor substrate 10 formed of a base region 110. The control passivation film 20 may be entirely formed on the back surface of the semiconductor substrate 10 and be in contact with the back surface of the semiconductor substrate 10.

In the embodiment, the control passivation film 20 may have an amorphous structure so that diffusion regions 320 and 340 (refer to FIG. 5D) can be easily formed as stated above. The control passivation film 20 having the amorphous structure may be easily formed by a thermal oxidation process performed at atmospheric pressure and a process temperature of 600° C. to 800° C. More particularly, in the forming of the control passivation film 20, a temperature increases from a temperature of 500° C. or less to the process temperature of 600° C. to 800° C. by heating, and the thermal oxidation process is performed, and then, a temperature decreases to a temperature of 500° C. or 550° C. under the atmospheric pressure. More particularly, in the embodiment, by the thermal oxidation process, an additional heat-treatment for densifying the control passivation film 20 after forming the control passivation film 20 and before forming the semiconductor layer 30 may be omitted. Then, the control passivation film 20 having the amorphous structure may be formed by a simple process.

The atmosphere during the thermal oxidation process may include an oxygen gas that is a raw gas, and may further include a halogen gas. The halogen gas increases a purity and a property of the control passivation film 20. As the halogen gas, a chlorine gas may be used because the chlorine gas may be easily obtained and may be relatively chemically stable. As another example, the atmosphere during the thermal oxidation process for forming the control passivation film 20 may include an inert gas or a nitrogen gas. As an example, the atmosphere may include an inert gas or a nitrogen gas only. A still another example, in the thermal oxidation process, oxygen may be resolved and obtained from a gas including ozone by using ultraviolet (UV) and the control passivation film 20 may be formed by using the oxygen resolved from the ozone.

However, the embodiments of the invention are not limited thereto. That is, when diffusion regions 320 and 340 are not included, the forming process of the control passivation film 20 may be not limited in the above process. In this instance, the control passivation film 20 may be formed by, for example, a thermal growth method, a deposition method (for example, a chemical vapor deposition (PECVD), an atomic layer deposition (ALD)), a chemical oxidation, or so on. Also, the control passivation film 20 may be formed by any of various other methods.

Figure 5B:
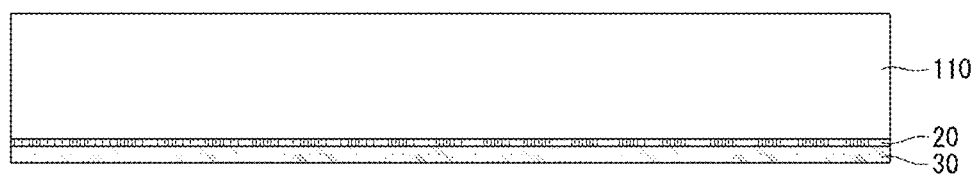
Figure 5C:
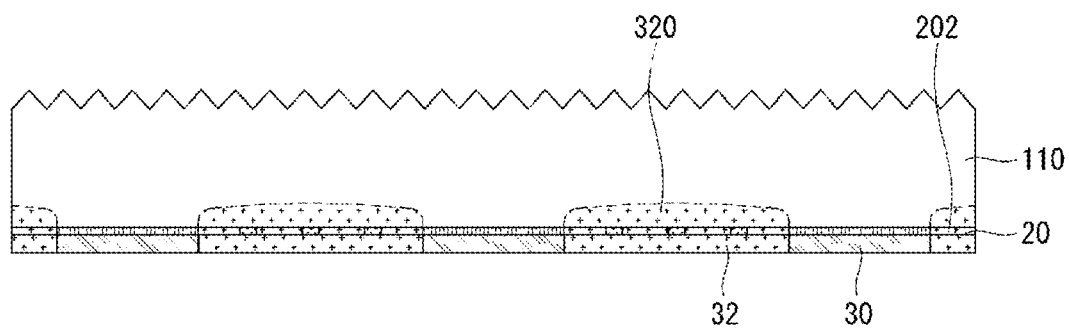
Figure 5D:
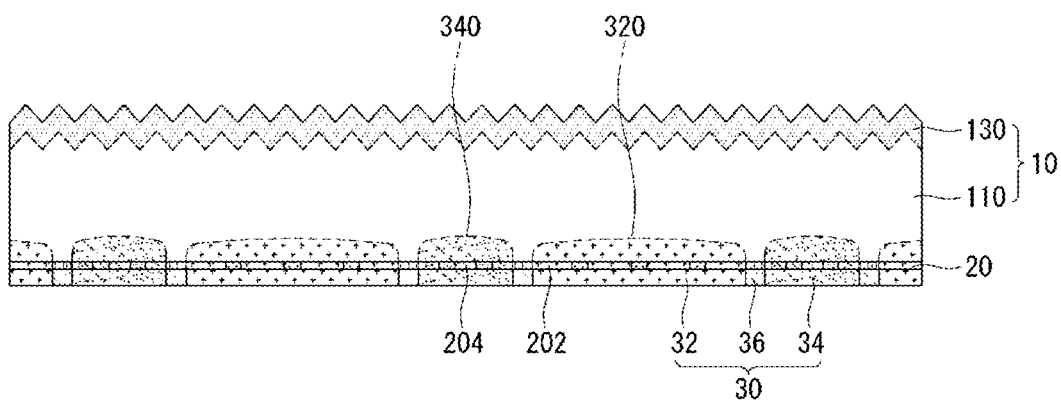

Subsequently, as shown in FIGS. 5b to 5d, a first conductive region 32 and a second conductive region 34 are formed on the control passivation film 20 and a front surface field region 130 is formed on the front surface of the semiconductor substrate 10. This will be described below in more detail. In some embodiments, during or after forming the first and the second conductive regions 32 and 34, first and second diffusion regions 320 and 340 may be formed. Also, an anti-reflection structure (for example, a texturing structure) may be formed at the front surface of the semiconductor substrate 10. This will be described below in more detail.

As shown in FIG. 5B, a semiconductor layer 30 is formed on the control passivation film 20. In this instance, the semiconductor layer 30 may be intrinsic.

As in the above, in the embodiment, the semiconductor layer 30 includes a poly-crystalline portion 302 (refer to FIG. 1) having a poly-crystalline structure with a nanometer-sized grain (as an example, having a grain size of 300 nm or less) or has a grain size less than a thickness of the semiconductor layer 30, and may further include an amorphous portion 304 (refer to FIG. 1) having an amorphous structure. The semiconductor layer 30 may be formed by a deposition performed under a pressure lower than the pressure of the process for forming the control passivation film 20, a process temperature of 700° C. or less, and an atmosphere having a gas including a material for a semiconductor.

When the deposition pressure of the semiconductor layer 30 may be lower than of the pressure for forming the control passivation film 20 or the atmospheric pressure, an increase in the grain size or the crystallinity of the semiconductor layer 30 due to the rapid growth of the semiconductor layer 30 may be reduced or prevented. More particularly, the deposition pressure of the semiconductor layer 30 may be 10 mtorr to 10 torr. This deposition pressure range is limited so that the semiconductor layer 30 is smoothly formed and also the increase in the grain size of the semiconductor layer 30 is reduced or prevented. However, the embodiments of the invention are not limited thereto.

Also, when the deposition temperature of the semiconductor layer 30 is 700° C. or less, the increase in the grain size or the crystallinity of the semiconductor layer 30 due to the rapid growth of the semiconductor layer 30 at a high temperature may be reduced or prevented. As an example, the semiconductor layer 30 may be deposited under the process temperature of 580 to 700° C. When the process temperature is less than 580° C., the semiconductor layer 30 may be formed of the amorphous structure only, and thus, the high electric property due to the poly-crystalline structure may be not achieved.

More particularly, in the forming of the semiconductor layer 30, a temperature increases from a temperature of 500° C. or 600° C. to the process temperature of 700° C. or less, and the deposition is performed, and then, a temperature decreases to 500° C. or 600° C. Thereby, bad influence on the semiconductor substrate 10 and the control passivation film 20 due to the rapid temperature change may be induced. However, the embodiments of the invention are not limited thereto.

In the embodiment, by limiting the pressure and the process temperature during the process for forming or depositing the semiconductor layer 30, the rapid growth of the semiconductor layer 30 can be prohibited and thus the semiconductor layer 30 having the small grain size can be easily formed. It is expected that the semiconductor material is grown in the state that the semiconductor material is scattered without the aggregation under the above process conditions. Unlike this, if the semiconductor layer is formed under high pressure (as an example, the atmospheric pressure or more) and a process temperature more than 700° C., the growth velocity of the semiconductor layer is large and thus it may be difficult to form the poly-crystalline portion 302 having the poly-crystalline structure with the nanometer-sized grain. If the grain size of the semiconductor layer 30 is large, the crystallinity of the semiconductor layer 30 may be changed and the passivation property may be deteriorated during a heat-treatment process at a high temperature, which will be performed later.

The gas including a material for a semiconductor, and included in the atmosphere in the deposition process of the semiconductor layer 30 may include a compound silicon and hydrogen (as an example, silane ($SiH_4$)). Also, the atmosphere may include a nitrogen gas, along with the gas including a material for a semiconductor. The nitrogen gas may control a partial pressure during the deposition process of the semiconductor layer 30. However, if an amount of the nitrogen gas increases, the grain size of the semiconductor layer 30 may increase. And thus, the nitrogen gas may be included by 20 vol % or less. In order to effectively control the grain size of the semiconductor layer 30, the nitrogen gas may be included by 10 vol % or less (more particularly, 5 vol % or less). Or, in order to effectively prevent the grain size of the semiconductor layer 30 from increasing, the atmosphere need not include the nitrogen gas. Also, the atmosphere need not include a hydrogen gas formed of hydrogen (as an example, $H_2$), which is not the hydrogen included in the compound of the gas including a material for a semiconductor, or may include the hydrogen gas by 45 vol % or less. If the amount of the hydrogen gas is more than 45 vol %, it may be difficult to maintain the grain size of the poly-crystalline portion 302 included in the semiconductor layer 30 to the above small size.

As in the above, in the embodiment, by limiting the temperature, the pressure, and the atmosphere during the deposition process of the semiconductor layer 30, the semiconductor layer 30 including the poly-crystalline portion 302 having the desired grain size can be formed.

In the embodiment, an additional heat-treatment for changing crystal properties of the semiconductor layer 30 may be not omitted between the deposition process and the doping process of the semiconductor layer 30. Thus, the semiconductor layer 30 having the desired crystal properties can be formed by a simple process. However, the embodiments of the invention are not limited thereto. After forming the semiconductor layer 30, an additional heat-treatment for re-crystallizing the amorphous portion 304 may be performed so that the passivation property can be high. As an example, after forming the semiconductor layer 30, the amorphous portion 304 may be re-crystallized by a laser.

In the above, the semiconductor layer 30 having the specific crystal structure is discussed by example. However, the semiconductor layer 30 may have a crystal structure different from that stated above. As an example, the semiconductor layer 30 may be formed of a microcrystalline, amorphous, or poly-crystalline semiconductor. In this instance, the semiconductor layer 30 may be formed by, for example, a thermal growth method, a deposition method (for example, a low pressure chemical vapor deposition method (LPCVD)), and so on. Various other methods may be applied.

Although the semiconductor layer 30 is formed only on the back surface of the semiconductor substrate 10 in drawings, the embodiments of the invention are not limited thereto. The semiconductor layer 30 may additionally be formed on the front surface and/or the side surface of the semiconductor substrate 10 according to the method of forming the semiconductor layer 30. The semiconductor layer 30, which is formed on, for example, on the front surface of the semiconductor substrate 10, may be removed later in a separate operation.

Subsequently, as shown in FIG. 5c, a portion of the semiconductor layer 30 may be doped with a first conductive type dopant so as to form the first conductive area 32 and the front surface of the semiconductor substrate 10 may be subjected to texturing so at to form an anti-reflection structure, and then, as shown in FIG. 5D, the front surface of the semiconductor substrate 10 and another portion of the semiconductor layer 30 may be doped with a second conductive type dopant so as to form the front field area 130 and the second conductive area 34. In this instance, an undoped area, which is not doped with a dopant, may be located between the first conductive area 32 and the second conductive area 34, and this area may be a barrier area 36.

In this instance, in the embodiment, during or after forming the first and the second conductive regions 32 and 34, first and the second diffusion regions 320 and 340 may be formed. As an example, the first conductive region 32 and the first diffusion region 320 are formed, and then, the second conductive region 34 and the second diffusion region 340 are formed in drawings.

That is, as shown in FIG. 5C, the first conductive region 32 and the first diffusion region 320 may be firstly formed. As an example, the first conductive region 32 and the first diffusion region 320 may be formed by forming a first dopant layer having the first conductive type dopant on the semiconductor layer 30 at a portion where the first conductive region 32 will be formed and then heat-treating the same (as an example, using a laser irradiation). Then, when the first conductive region 32 is formed, the first conductive type dopant penetrates the first conductive region 32 (or the semiconductor layer 30) and the control passivation film 20 and then reaches the semiconductor substrate 10, thereby forming the first diffusion region 320. As another example, the first conductive region 32 is formed at the semiconductor layer 30, and then, the first conductive type dopant included in the first conductive region 32 is diffused by heat-treating the first conductive region 32. Then, the first conductive type dopant included in the first conductive region 32 penetrates the control passivation film 20 and then reaches the semiconductor substrate 10, thereby forming the first diffusion region 320. In this instance, for heat-treating of the first conductive region 32, various methods may be applied, as an example, a laser may be used.

However, the embodiments of the invention are not limited thereto. The first conductive region 32 and the first diffusion region 320 may be formed by using various methods, such as an ion implantation, or a thermal diffusion, which is a heat-treatment using a gas including a dopant or a heat-treatment performed after a formation of a doping layer.

Texturing on the front surface of the semiconductor substrate 10 may be wet or dry texturing. Wet texturing may be performed by dipping the semiconductor substrate 10 in a texturing solution. The wet texturing has an advantage of short process time. Dry texturing is the process of cutting the surface of the semiconductor substrate 10 using, for example, a diamond grill or laser, and may cause an extended process time and damage to the semiconductor substrate 10, although it may result in the formation of uniform protrusions. In addition, the semiconductor substrate 10 may be textured via, for example, reactive ion etching (RIE). As described above, in the invention, the semiconductor substrate 10 may be textured via various methods.

Subsequently, as shown in FIG. 5D, the second conductive region 34, the second diffusion region 340, and the front surface field region 130 are formed.

As an example, the second conductive region 34 and the second diffusion region 340 may be formed by forming a second dopant layer having the second conductive type dopant on the semiconductor layer 30 at a portion where the second conductive region 34 will be formed and then heat-treating the same (as an example, using a laser irradiation). Then, when the second conductive region 34 is formed, the second conductive type dopant penetrates the second conductive region 34 (or the semiconductor layer 30) and the control passivation film 20 and then reaches the semiconductor substrate 10, thereby forming the second diffusion region 340. As another example, the second conductive region 34 is formed at the semiconductor layer 30, and then, the second conductive type dopant included in the second conductive region 34 is diffused by heat-treating the second conductive region 34. Then, the second conductive type dopant included in the second conductive region 34 penetrates the control passivation film 20 and then reaches the semiconductor substrate 10, thereby forming the second diffusion region 340. In this instance, for heat-treating of the second conductive region 34, various methods may be applied, as an example, a laser may be used.

However, the embodiments of the invention are not limited thereto. The second conductive region 34 and the second diffusion region 340 may be formed by using various methods, such as an ion implantation, or a thermal diffusion, which is a heat-treatment using a gas including a dopant or a heat-treatment performed after a formation of a doping layer.

Also, the front surface field region 130 may be formed by using various methods, such as an ion implantation, or a thermal diffusion, which is a heat-treatment using a gas including a dopant or a heat-treatment performed after a formation of a doping layer.

More particularly, the second conductive region 34, the second diffusion region 340 and the front surface field region 130 may be simultaneously formed by the same process, that is, a thermal diffusion using a gas including the second conductive type dopant. According to this, the process can be largely simplified.

In the embodiment, the second conductive region 34 and the second diffusion region 340 are formed after forming the first conductive region 32 and the first diffusion region 320, by example. However, the embodiments of the invention are not limited thereto. The first and second diffusion regions 320 and 340 may be simultaneously or individually formed by a heat-treatment after forming the first and second conductive regions 32 and 34. Also, in the embodiment, both of the first and second diffusion regions 320 and 340 are included, by example. As another example, only one of the first and second diffusion regions 320 and 340 may be included, or both of the first and second diffusion regions 320 and 340 are not included.

In addition, the front surface field region 130 is simultaneously formed with the second conductive region 34 and/or the second diffusion region 340 by the same doping process, by example. However, the front surface field region 130 may be formed by a separate process.

That is, a sequence of forming the first conductive region 32, the second conductive region 34, the front surface field region 130, the first and the second diffusion regions 320 and 340 and the texturing structure may be altered in various ways.

Figure 5E:
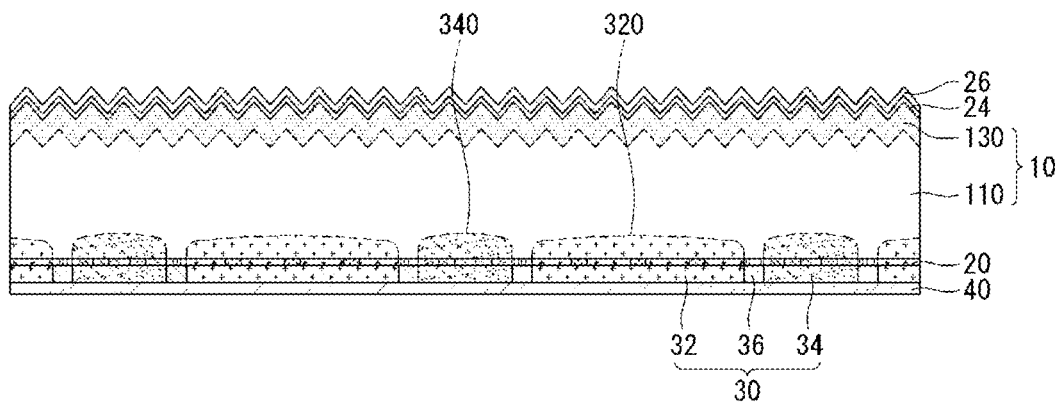

Subsequently, as shown in FIG. 5E, other insulation films are formed on the front surface and the back surface of the semiconductor substrate 10. That is, a front passivation film 24 and an anti-reflection film 26 are formed on the front surface of the semiconductor substrate 10, and a back passivation film 40 is formed on the back surface of the semiconductor substrate 10 (particularly, on the back surface of the semiconductor substrate 30).

More specifically, the front passivation film 24 and the anti-reflection film 26 are formed on the entire front surface of the semiconductor substrate 10, and the back passivation film 40 is formed on the entire back surface of the semiconductor substrate 10. The front passivation film 24, the anti-reflection film 26, or the back passivation film 40 may be formed via various methods such as, for example, vacuum deposition, chemical vapor deposition, spin coating, screen printing, or spray coating. The sequence of forming the front passivation film 24, the anti-reflection film 26, and the back passivation film 40 is not defined.

Figure 5F:
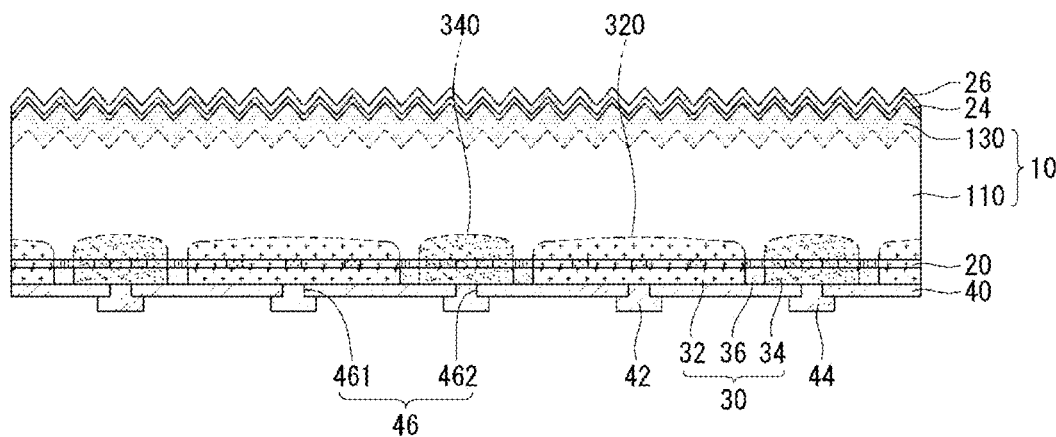

Subsequently, as illustrated in FIG. 5F, first and second electrodes 42 and 44, which are respectively connected to the first and second conductive regions 32 and 34, are formed.

As an example, contact holes 46 are formed at the back passivation film 40 via patterning, and thereafter the contact holes 46 are filled with the first and second electrodes 42 and 44. At this time, the contact holes 46 may be formed via various methods such as laser ablation using a laser, or etching using an etching solution or etching paste. In addition, the first and second electrodes 42 and 44 may be formed via various other methods, such as, for example, sputtering, plating, or deposition. Particularly, in the embodiment, the first and second electrodes 42 and 44 may be formed by sputtering.

However, the embodiments of the invention are not limited thereto. As another example, the first and second electrodes 42 and 44 having the above-described shape may be formed by applying paste for forming the first and second electrodes 42 and 44 to the back passivation film 40 via, for example, screen printing, and thereafter performing, for example, fire-through or laser firing contact. In this instance, because the contact holes 46 are formed when the first and second electrodes 42 and 44 are formed, a separate process of forming the contact holes 46 is unnecessary.

In the embodiment, the control passivation film 20 and the semiconductor layer 30 having desired properties can be easily formed by limiting process conditions. By the control passivation film 20, the diffusion regions 320 and 340 can be easily formed at the inside of the semiconductor substrate 10 to correspond to the conductive regions 32 and 34. In addition, the semiconductor layer 30 has low crystallinity or a small grain size, and thus, the variation of the crystallinity of the semiconductor layer 30 may be prevented or decreased even after heat-treatment process at high-temperature. Accordingly, the method for manufacturing the solar cell 100 having enhanced efficiency can be simplified.

In the above embodiment, the first and second conductive regions 32 and 34 and the first and second electrodes 42 and 44 are on the back surface of the semiconductor substrate 10, by example. However, the embodiments of the invention are not limited thereto. The control passivation film 20, the first and second conductive regions 32 and 34, and the diffusion regions 320 and 340 may be applied to solar cells 100 having different structures.

Hereinafter, a solar cell and a method for manufacturing the same according to other embodiments of the invention will be described. A detailed description related to parts that are the same or extremely similar to those of the above embodiments will be omitted below and the following descriptions will be focused on different parts. In addition, combinations of the above-described embodiments or alterations thereof with the following embodiments or alterations thereof fall within the scope of the invention.

Figure 6:
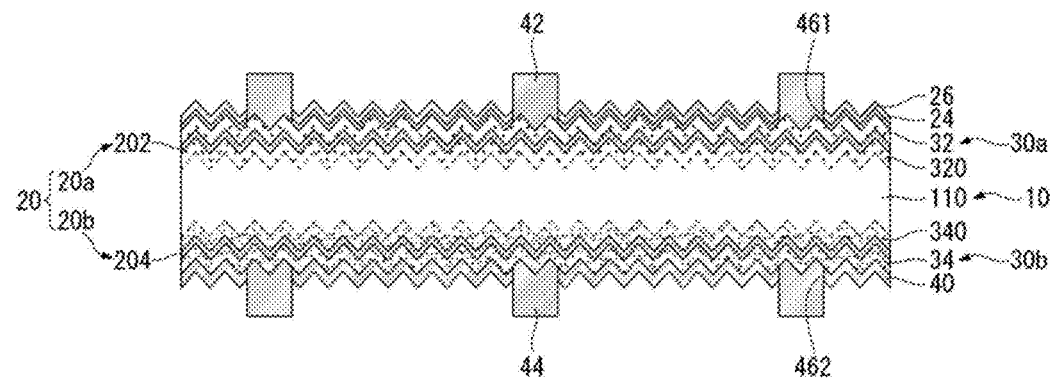
FIG. 6 is a cross-sectional view of a solar cell according to another embodiment of the invention.
Figure 7:
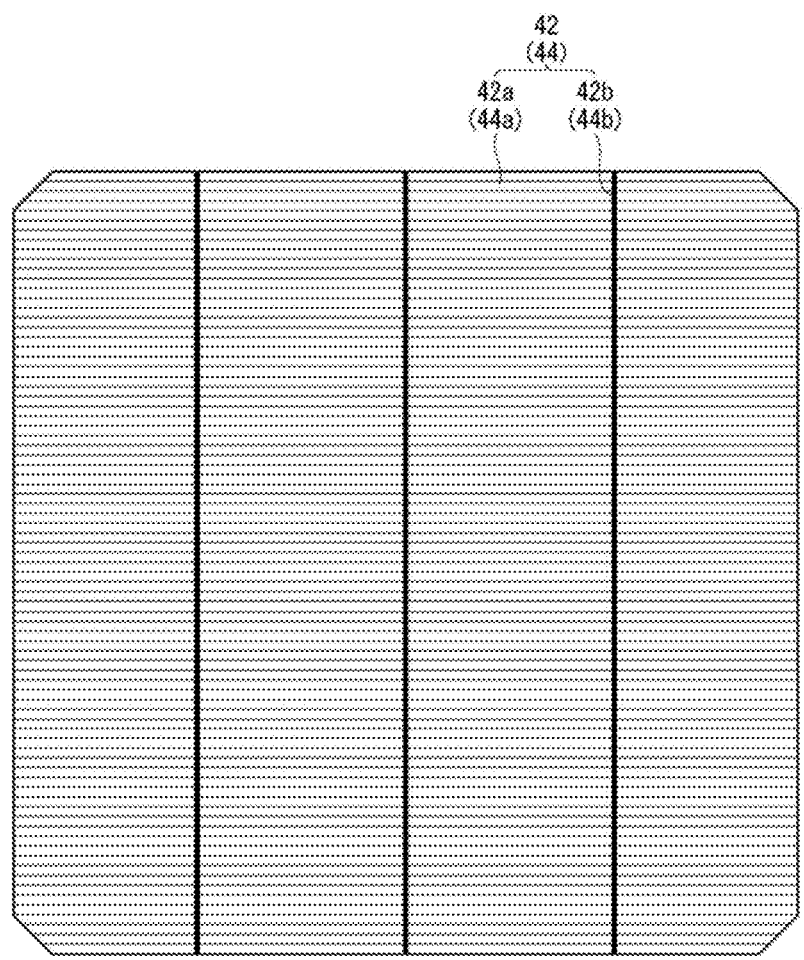
FIG. 7 is a plan view of the solar cell shown in FIG. 6.

FIG. 6 is a cross-sectional view of a solar cell according to another embodiment of the invention, and FIG. 7 is a plan view of the solar cell shown in FIG. 6.

Referring to FIGS. 6 and 7, in the embodiment, a first conductive region 32 is disposed on a first control passivation film 20a on one surface of a semiconductor substrate 10, and a second conductive region 34 is disposed on a second control passivation film 20a on the other surface of the semiconductor substrate 10. In this instance, the first control passivation film 20a and the first conductive region 32 may be disposed on an entire portion of the one surface of the semiconductor substrate 10, and the second control passivation film 20b and the second conductive region 34 may be disposed on an entire portion of the other surface of the semiconductor substrate 10. In this embodiment, the front surface field region 130 is not included, unlike the embodiment described with reference to FIGS. 1 to 5.

As an example, the first control passivation film 20a may be in contact with the semiconductor substrate 10, and the first conductive region 32 may be in contact with the first control passivation film 20a. As an example, the second control passivation film 20b may be in contact with the semiconductor substrate 10, and the second conductive region 34 may be in contact with the second control passivation film 20b.

In this instance, the first and second control passivation films 20a and 20b may be the same as or very similar to the control passivation film 20 of the above-described embodiment. Also, the first and the second control passivation films 20a and 20b may be formed by a method the same as the method for forming the control passivation film 20 of the above-described embodiment. As an example, during a process forming the control passivation film 20, the first control passivation film 20a disposed on the front surface of the semiconductor substrate 10 and the second control passivation film 20b disposed on the back surface of the semiconductor substrate 10 may be simultaneously formed by the same process or by one process. In this instance, an entire portion of the first control passivation film 20a may be formed of a first doped portion 202 including a first conductive type dopant, and an entire portion of the second control passivation film 20b may be formed of a second doped portion 204 including a second conductive type dopant. The first and second passivation films 20a and 20b may further include a highly doped portion 202a and 204a (refer to FIG. 1).

In addition, the first and second conductive regions 32 and 34 may be the same as or very similar to the first and the second conductive regions 32 and 34 of the above-described embodiment, except to shapes and/or positions thereof. Accordingly, first and second semiconductor layers 30a and 30b constituting the first and second conductive regions 32 and 34, respectively, may have crystal properties the same as those of the semiconductor layer 30 (refer to FIG. 1). Also, the first and second semiconductor layers 30a and 30b may be formed by a method the same as a method for forming the semiconductor layer 30. As an example, during a process forming the semiconductor layer 30, the first semiconductor layer 30a on the first control passivation film 20a disposed on the front surface of the semiconductor substrate 10 and the second semiconductor layer 30b on the second control passivation film 20b disposed on the back surface of the semiconductor substrate 10 may be simultaneously formed by the same process or by one process.

Also, in the embodiment, a first diffusion region 320 may be entirely formed at a portion of the semiconductor substrate 10 adjacent to the first control passivation film 20a under the first conductive region 32, and a second diffusion region 340 may be entirely formed at a portion of the semiconductor substrate 10 adjacent to the second control passivation film 20b under the second conductive region 34. Also, an entire portion of the first control passivation film 20a may be formed of the first doped portion 202, and an entire portion of the second control passivation film 20a may be formed of the second doped portion 204. With respect to the first and second diffusion regions 320 and 340, and the first and second doped portions 202 and 204, descriptions (more particularly, descriptions on the doping profile) in the above-mentioned embodiments with reference to FIGS. 1 to 4, and 5a and 5f or descriptions in after-mentioned embodiments with reference to FIGS. 8, 9, 10a to 10h, and 11 to 13 may be applied, except for a plane shape.

In the embodiment, the first and second control passivation films 20a and 20b and the first and second conductive regions 32 and 34 have the properties stated above-mentioned embodiments and both of the first and the second diffusion regions 320 and 340 are included, by example. However, the embodiments of the invention are not limited thereto. Thus, at least one of the first and second control passivation films 20a and 20b and/or at least one of the first and second conductive regions 32 and 34 may have the properties stated in the above-mentioned embodiments. Also, only one of the first and second control passivation films 20a and 20b may be included, and one of the first and second conductive regions 32 and 34 may be in contact with the semiconductor substrate 10 or may constitute a part of the semiconductor substrate 10. Also, only one of the first and second diffusion regions 320 and 340 may be included, or both of the first and second diffusion regions 320 and 340 may be not included.

A front passivation film 24 and an anti-reflection film 26 may be disposed on a substantially entire portion of the first conductive region 32, except for a first contact hole 461, on the front surface of the semiconductor substrate 10. As an example, the front passivation film 24 may be in contact with the first conductive region 32, and the anti-reflection film 26 may be in contact with the front passivation film 24. The back passivation film 40 may be disposed on a substantially entire portion of the second conductive region 34, except for a second contact hole 462, on the back surface of the semiconductor substrate 10. As an example, the back passivation film 40 may be in contact with the second conductive region 34.

A first electrode 42 is disposed on the first conductive region 32 and is electrically connected to (as an example, is in contact with) the first conductive region 32. Similarly, a second electrode 44 is disposed on the second conductive region 34 and is electrically connected to (as an example, is in contact with) the second conductive region 34. The first electrode 42 may be electrically connected to the first conductive region 32 through the first contact hole 461 formed at the front passivation film 24 and the anti-reflection film 26 (that is, by penetrating the front passivation film 24 and the anti-reflection film 26). The second electrode 44 may be electrically connected to the second conductive region 34 through the second contact hole 462 formed at the back passivation film 40 (that is, by penetrating the back passivation film 40).

By example, an anti-reflection structure is formed at the front and back surfaces of the semiconductor substrate 10 in FIG. 6. However, the embodiments of the invention are not limited thereto. The anti-reflection structure may be formed at only one of the front and back surfaces, or the anti-reflection structure may be not formed on both of the front and back surfaces.

Plan shapes of the first and second electrodes 42 and 44 will be described in detail with reference to FIG. 7.

Referring to FIG. 7, the first and second electrodes 42 and 44 may include a plurality of finger electrodes 42a and 44a, which are spaced apart from one another at a constant pitch. Although FIG. 7 illustrates that the finger electrodes 42a and 44a are parallel to one another and are also parallel to the edge of the semiconductor substrate 10, the embodiments of the invention are not limited thereto. In addition, the first and second electrodes 42 and 44 may include bus bar electrodes 42b and 44b, which are formed in the direction crossing the finger electrodes 42a and 44a so as to connect the finger electrodes 42a and 44a to one another. Only one bus bar electrode 42b or 44b may be provided, or a plurality of bus bar electrodes 42b or 44b may be arranged at a larger pitch than the pitch of the finger electrodes 42a and 44a as exemplarily illustrated in FIG. 7. In this instance, although the width of the bus bar electrodes 42b and 44b may be larger than the width of the finger electrodes 42a and 44a, the embodiments of the invention are not limited thereto. Accordingly, the width of the bus bar electrodes 42b and 44b may be equal to or less than the width of the finger electrodes 42a and 44a.

When viewing the cross section, both the finger electrodes 42a and the bus bar electrodes 42b of the first electrode 42 may be formed so as to penetrate the front passivation film 24 and the anti-reflection film 26. That is, the first contact hole 461 may be formed so as to correspond to both the finger electrodes 42a and the bus bar electrodes 42b of the first electrode 42. In addition, both the finger electrodes 44a and the bus bar electrodes 44b of the second electrode 44 may be formed so as to penetrate the back passivation film 40. That is, the second contact hole 462 may be formed so as to correspond to both the finger electrodes 44a and the bus bar electrodes 44b of the second electrode 44. However, the embodiments of the invention are not limited thereto. In another example, the finger electrodes 42a of the first electrode 42 may be formed so as to penetrate the front passivation film 24 and the anti-reflection film 26, and the bus bar electrodes 42b may be formed on the front passivation film 24 and the anti-reflection film 26. In addition, the finger electrodes 44a of the second electrode 44 may be formed so as to penetrate the back passivation film 40, and the bus bar electrodes 44b may be formed on the back passivation film 40.

Although FIG. 7 illustrates that the first electrode 42 and the second electrode 44 have the same shape. However, the embodiments of the invention are not limited thereto, and the widths and pitches of the finger electrodes 42a and the bus bar electrodes 42b of the first electrode 42 may be different from the widths and pitches of the finger electrodes 44a and the bus bar electrodes 44b of the second electrode 44. In addition, the first electrode 42 and the second electrode 44 may have different shapes, and various other alterations are possible.

In the embodiment, the first and second electrodes 42 and 44 of the solar cell 100 have a given pattern so that the solar cell 100 has a bi-facial structure for allowing light to be introduced into the front surface and the back surface of the semiconductor substrate 10. Thereby, the quantity of light used in the solar cell 100 may be increased, which may contribute to the improvement of the efficiency of the solar cell 100. However, the embodiments of the invention are not limited thereto. The second electrode 44 may be formed on the entire back surface of the semiconductor substrate 10, and various other alterations are possible.

Figure 8:
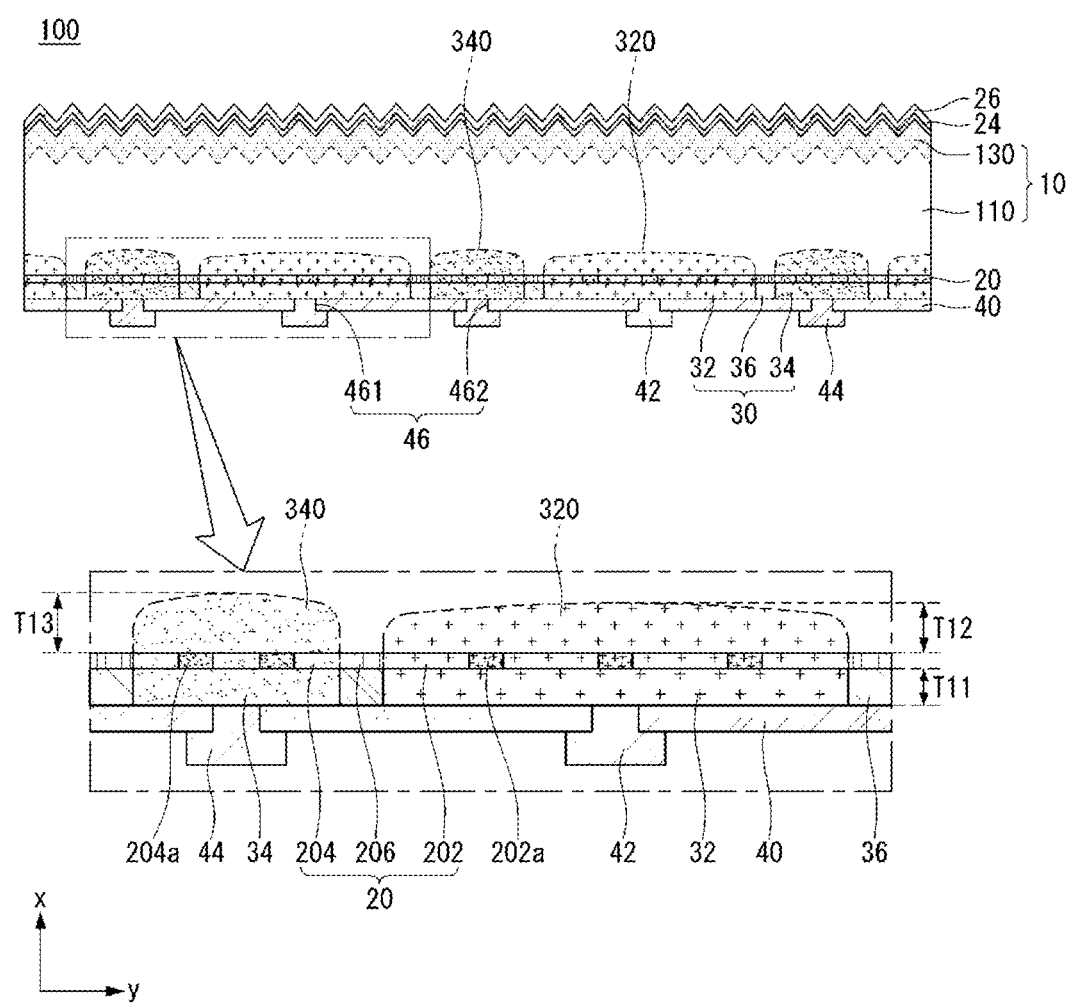
FIG. 8 is a cross-sectional view of a solar cell according to yet another embodiment of the invention.
Figure 9:
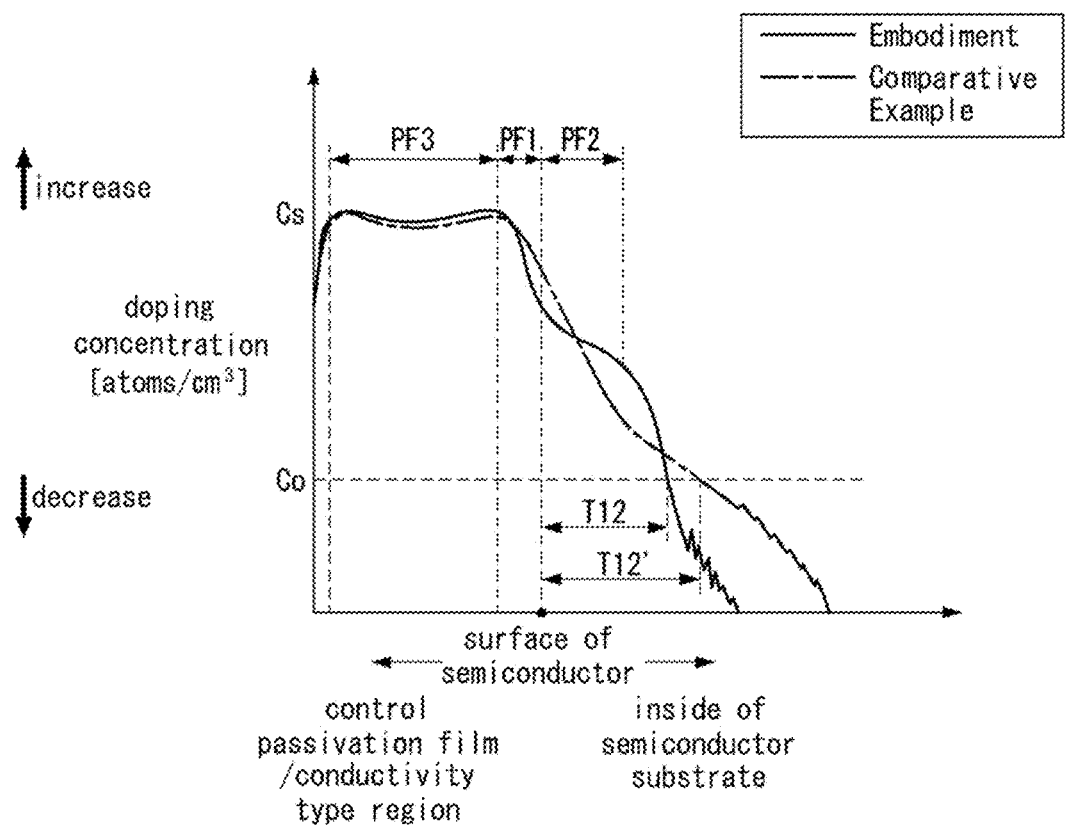
FIG. 9 is a graph of a doping profile in a first conductive region, a first doped portion, and a first diffusion region included in the solar cell shown in FIG. 8.

FIG. 8 is a cross-sectional view of a solar cell according to yet another embodiment of the invention. FIG. 9 is a graph of a doping profile in a first conductive region 32, a first doped portion 202, and a first diffusion region 320 included in the solar cell shown in FIG. 8. For reference, the doping profile shown in FIG. 9 illustrates a result measured by a secondary ion mass spectrometry.

In the embodiment, a first conductive region 32, and a first doped portion 202 and a first diffusion region 320 related thereto may have a specific doping profile. More particularly, a region acting as an emitter region and having a conductive type opposite to that of a base region 110 between first and second conductive regions 32 and 34 (for example, the first conductive region 32), and the first doped portion 202 and the first diffusion region 320 related thereto may be formed to have a specific doping profile. A region acting as a back surface field region between the first and second conductive regions 32 and 34 (for example, the second conductive region 34) has a conductive type the same as that of the base region 110, and thus, a thickness and a total doping concentration of the diffusion region 320 or 340 related thereto may not largely affect the property of the solar cell 100. However, the embodiments of the invention are not limited thereto. At least one of the first and second conductive regions 32 and 34, and the doped portion 202 or 204, and the diffusion region 320 or 340 related thereto may have the after-mentioned doping profile. In this instance, in the specification, terms of "first" and "second" are used only for distinguishing them from one another, and thus, the embodiments of the invention are not limited thereto.

As shown in FIG. 9, in the embodiment, when viewed in a thickness direction of the solar cell 100, the doping concentration of the first conductive type dopant continuously decreases from the first conductive region 32 to the first diffusion region 320 via the control passivation film 20 or the first doped portion 202 in a doping profile.

In this instance, the control passivation film 20 or a portion of the first conductive region 32 adjacent thereto has a first doping profile PF1, and a portion of the first diffusion region 320 adjacent to the control passivation film 20 has a second doping profile PF2 different from the first doping profile PF1. More particularly, an absolute value of a second doping concentration gradient in the second doping profile PF2 may be smaller than an absolute value of a first doping concentration gradient in the first doping profile PF1. In this instance, the doping concentration gradient may be an average of a total difference of concentration gradients or be an average of all concentration gradients in an entire portion. That is, a degree that the doping concentration decreases in the control passivation film 20 or the portion of the first conductive region 32 adjacent thereto may be smaller than a degree that the doping concentration decreases in the portion of the first diffusion region 320 adjacent to the control passivation film 20. For example, the second doping profile PF2 may have a kind of a kink or a point of inflection. Thereby, the first diffusion region 320 adjacent to the control passivation film 20 may have a total doping concentration larger than that of a Comparative Example or the conventional structure and may be thinner than that of the Comparative Example or the conventional structure. This is because the manufacturing process for the first conductive region 32 and the first diffusion region 320 is improved in the embodiment.

On the other hand, in the Comparative Example where the manufacturing process is not improved, it can be seen that a doping concentration gradient in the control passivation film or the portion of the first conductive region adjacent thereto is the same as or similar to a doping concentration gradient in the portion of the first diffusion region adjacent to the control passivation film. This is because the first conductive type dopant is diffused so that a doping profile has an approximately linear shape. Accordingly, the doping profile in the control passivation film or the portion of the first conductive region adjacent thereto is the same as or similar to a doping profile in the portion of the first diffusion region adjacent to the control passivation film, and thus, a thickness T12' of the first diffusion region is relatively large.

This will be described in more detail later in a method for manufacturing the solar cell 100.

In the embodiment, a thickness T12 of the first diffusion region 320 may be 100 nm to 300 nm (as an example, 200 nm to 300 nm), a total doping concentration of the first diffusion region 320 may be $10^{17}/cm^3$ to $10^{19}/cm^3$. Also, a thickness T11 of the first conductive region 32 may be 400 nm or less (as an example, 100 nm to 400 nm), a total doping concentration of the first conductive region 32 may be $10^{20}/cm^3$ or more. In this instance, the thickness T12 of the first diffusion region 320 may be the same as or smaller than the thickness T11 of the first conductive region 32. Also, the total doping concentration of the first conductive region 32 may be 10 times the total doping concentration of the first diffusion region 320 or more. However, the embodiments of the invention are not limited thereto. The thicknesses and total doping concentrations of the first diffusion region 320 and the first conductive region 32 may be varied. For example, the thickness T12 of the first diffusion region 320 may be larger than the thickness T11 of the first conductive region 32.

As an example, the thickness T12 of the first diffusion region 320 may be defined as a distance from the surface of the semiconductor substrate 10 to a position having a reference doping concentration Co. The reference doping concentration Co is regarded as a doping concentration when it is substantially not-doped. For example, when the doping concentration is measured by the secondary ion mass spectrometry as in the above, the reference doping concentration Co may be $1 \times 10^{17}/cm^3$. The thickness T11 of the first conductive region 32 can be easily seen by measuring the semiconductor layer 30. Also, the total doping concentration may be defined by a value of a total amount of a dopant in the specific region divided by a total volume of the specific region.

As in the above, by reducing the thickness T12 of the first diffusion region 320 compared with the conventional structure (or the Comparative Example), open-circuit voltage can be enhanced. In this instance, because the first diffusion region 320 has the relatively total doping concentration (that is, $10^{19}/cm^3$ or less), Auger recombination can be minimized, and the recombination can be reduced by screening defect sites adjacent to the surface of the semiconductor substrate 10. Thus, the open-circuit voltage can be enhanced further. In addition, since the first diffusion region 320 has the total doping concentration larger than the certain value (that is, $10^{17}/cm^3$ or more), carriers generated at the semiconductor substrate 10 by photoelectric conversion can be easily supplied to the first conductive region 32.

Also, a portion of the first conductive region 32 spaced from or far away from the control passivation film 20 (the portion of the first conductive region 32 facing the first electrode 42) has a third doping profile PF3 different from the first and second doping profiles PF1 and PF2. In this instance, each of absolute values of the first and the second concentration gradients in the first and second doping profiles PF1 and PF2 may be larger than an absolute value of a third concentration gradient in the third doping profile PF3. This is because a portion having a same or similar doping concentration exits at the portion of the first conductive region 32 spaced from or far away from the control passivation film 20. Since the portion of the first conductive region 32 spaced from or far away from the control passivation film 20 is a side where the first conductive type dopant is applied, the portion of the first conductive region 32 spaced from or far away from the control passivation film 20 has the third doping profile PF3 having relatively high and uniform doping concentration, and the doping concentration decreases by penetrating the control passivation film 20 and the first diffusion region 320.

In the embodiment, the second conductive region 34, the second doped portion 204, and the second diffusion region 340 may have a doping profile of a form different from the doping profile of the first conductive region 32, the first doped portion 202, and the first diffusion region 320. For example, the second conductive region 34 has a relatively uniform and relatively high surface doping concentration Cs, and the doping concentration is continuously and gradually decreased with a linear shape or with a small gradient variation toward the control passivation film 20 and the second diffusion region 340 in the doping profile. As an example, the second conductive region 34, the second doped portion 204, and the second diffusion region 340 may have the doping profile similar to the Comparative Example of FIG. 9. This is because the second conductive region 34 is doped by a doping method different from that of the first conductive region 32 in a doping process different from that of the first conductive region 32. However, an absolute value of the doping concentration gradient of the second diffusion region 340 may be smaller than an absolute value of the first doping concentration gradient. However, the embodiments of the invention are not limited thereto.

As another example, the second conductive region 34, the second doped portion 204, and the second diffusion region 340 may have a doping profile of a form the same as or similar to the doping profile of the first conductive region 32, the first doped portion 202, and the first diffusion region 320. However, the specific doping concentration or the thickness T13 of the second diffusion region 340 may be the same as or different from the doping profile of the first conductive region 32, the first doped portion 202, and the second diffusion region 320.

As an example, when viewed in the thickness direction, an absolute value of a doping concentration gradient in the second diffusion region 340 may be smaller than an absolute value of the first doping concentration gradient in the first diffusion region 320. Also, the thickness T13 of the second diffusion region 340 having the second conductive type the same as that of the base region 110 may be larger than the thickness T12 of the first diffusion region 320 having the first conductive type. Here, the thickness of the second diffusion region 340 may be 800 nm or less (50 nm to 800 nm). However, the embodiments of the invention are not limited thereto.

A method for manufacturing a solar cell having the above doping profile will be described in detail with reference to FIGS. 10A to 10H, and 11 to 13. A detailed description related to parts that are the same or extremely similar to those of the above embodiments described with reference to FIGS. 5A to 5F will be applied to description related to FIGS. 10A to 10H and thus will be omitted below.

FIGS. 10A to 10H are cross-sectional views of a method for manufacturing a solar cell 100 according to another embodiment of the invention.

Figure 10A:
FIGS. 10A to 10H are cross-sectional views of a method for manufacturing a solar cell according to another embodiment of the invention.

First, as illustrated in FIG. 10A, a control passivation film 20 is formed on a back surface of a semiconductor substrate 10 formed of a base region 110.

Subsequently, as shown in FIGS. 10B to 10F, a first conductive region 32 and a second conductive region 34 are formed on the control passivation film 20 and a front surface field region 130 is formed on the front surface of the semiconductor substrate 10. Also, an anti-reflection structure (for example, a texturing structure) may be formed at the front surface of the semiconductor substrate 10. This will be described below in more detail.

Figure 10B:
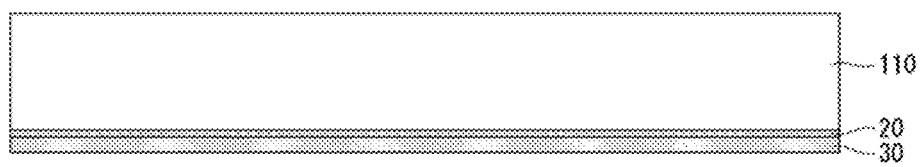

As shown in FIG. 10B, a semiconductor layer 30 is formed on the control passivation film 20.

Figure 10C:
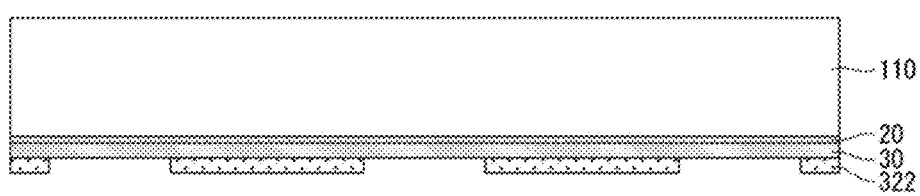
Figure 10D:
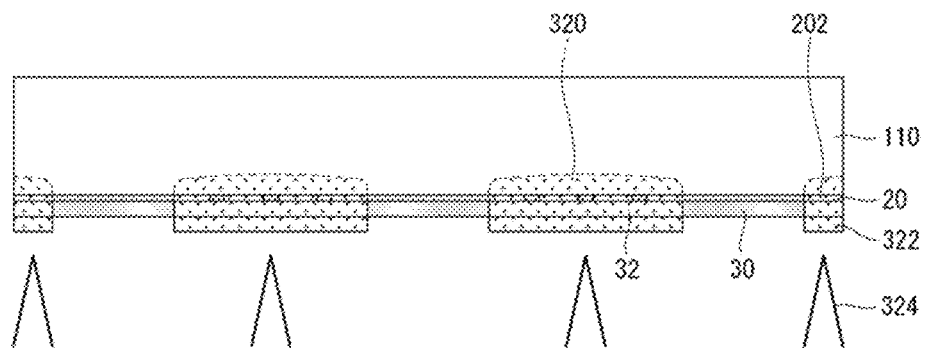
Figure 10E:
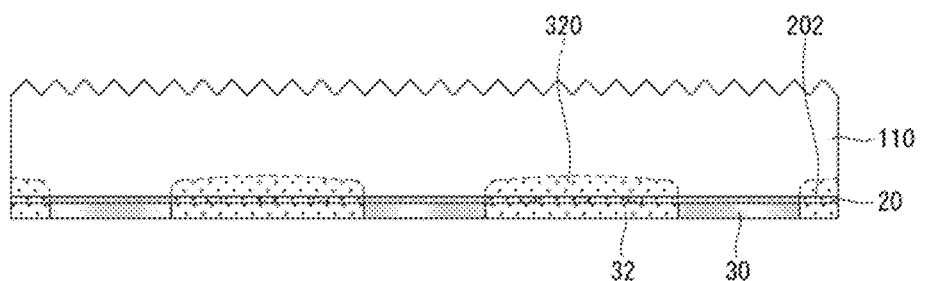
Figure 10F:
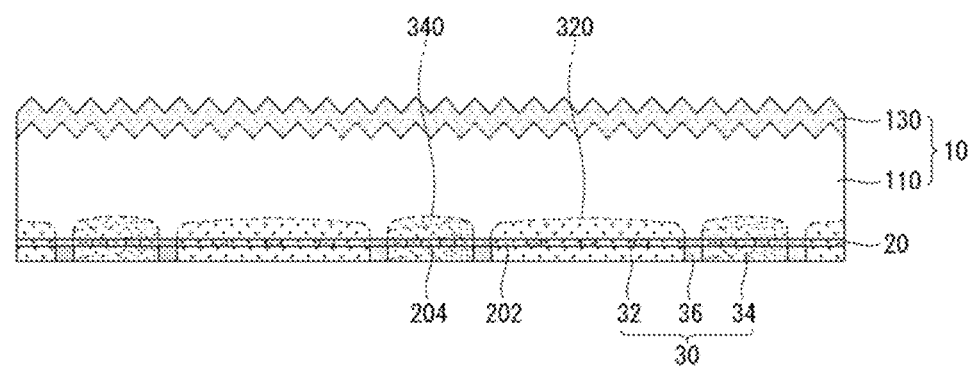

Subsequently, as shown in FIGS. 10c to 10e, a portion of the semiconductor layer 30 may be doped with a first conductive type dopant so as to form the first conductive area 32 and the front surface of the semiconductor substrate 10 may be subjected to texturing so at to form an anti-reflection structure, and then, as shown in FIG. 10F, the front surface of the semiconductor substrate 10 and another portion of the semiconductor layer 30 may be doped with a second conductive type dopant so as to form the front field area 130 and the second conductive area 34. In this instance, an undoped area, which is not doped with a dopant, may be located between the first conductive area 32 and the second conductive area 34, and this area may be a barrier area 36.

In this instance, in the embodiment, the first conductive region 32, a first doping portion 202, and a first diffusion region 320 are simultaneously formed, by example, and then, the second conductive region 34, a second doping portion 204, and a second diffusion region 340 are simultaneously formed.

First, as shown in FIG. 10C, a first dopant layer 322 including a first conductive type dopant is formed on the intrinsic semiconductor layer 30 at a portion where a first conductive region 32 will be formed. The first dopant layer 322 may be formed of various materials including the first conductive type dopant, for example, an insulating layer or a semiconductor layer including the first conductive type dopant. The first dopant layer 322 may include at least one layer or a plurality of layers selected from a group consisting of a silicon nitride, silicon oxide, or amorphous silicon film including the first conductive type dopant. For example, the first dopant layer 322 may be formed by a thermal growth method, a deposition method, and so on. Various other methods may be applied.

Subsequently, as shown in FIG. 10D, the first conductive type dopant included in the first dopant layer 322 is diffused into the semiconductor layer 30 by using a laser 324, and thus, the first conductive region 32 is formed. In this instance, the first conductive type dopant is diffused into a part of the control passivation film 20 and a part of the semiconductor substrate 10, and thus, the first doped portion 202 and the first diffusion region 320 are formed together.

In this instance, the laser 324 may be irradiated with a defocused state. According to a shape of a laser beam, whether the laser 324 has the defocused state or a focused state may be easily distinguished. This will be described in detail with reference to FIG. 11.

Figure 11:
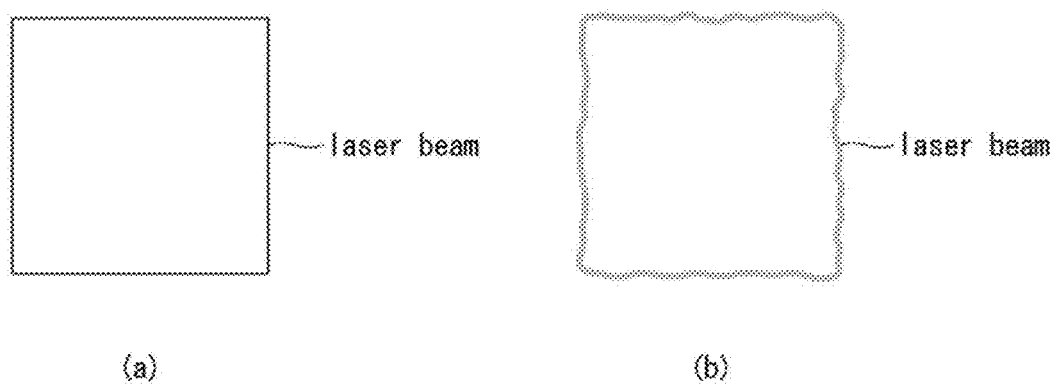
FIG. 11 schematically shows shapes of laser beams formed at a first dopant layer by a doping process shown in FIG. 10D and included in the method for manufacturing the solar cell, wherein (a) shows a shape of a laser beam using a focused laser and (b) shows a shape of a laser beam using a defocused laser.

FIG. 11 schematically shows shape of laser beams formed at the first dopant layer 322 by the doping process shown in FIG. 10D and included in the method for manufacturing the solar cell 100, wherein (a) shows a shape of a laser beam using a focused laser and (b) shows a shape of a laser beam using a defocused laser.

As shown in (a) of FIG. 11, by using the laser 324 with the focused state (for example, the laser 324 which is focused onto the first dopant layer 322), a boundary line of the laser beam formed at the first dopant layer 322 is clear, vivid, and thin. On the other hand, as shown in (b) of FIG. 11, by using the laser 324 with the defocused state (for example, the laser 324 which is not focused onto the first dopant layer 322), a boundary line of the laser beam formed at the first dopant layer 322 is not clear, not vivid, and is spread. Thus, according to the shape of the laser beam, whether the laser 324 has the defocused state or the focused state may be distinguished. However, the embodiments of the invention are not limited thereto. Thus, whether the laser 324 has the defocused state or the focused state may be distinguished by any of various methods.

When the laser 324 with the defocused stated is used in the doping process, the first conductive type dopant included in the first dopant layer 322 penetrates through the control passivation film 20, and then, is accumulated at a portion adjacent to the control passivation film 20. Thereby, the total doping concentration of the first diffusion region 320 may increase and a thickness T12 (refer to FIG. 8) of the first diffusion region 320 may be minimized. That is, the doping profile of the first conductive region 32, the first doped portion 202, and the first diffusion region 320 may be controlled or adjusted by the layer 324, which is defocused onto the first dopant layer 322. Accordingly, as described in the embodiments in FIGS. 8 and 9, the doping profile has the first to third doping profiles PF1, PF2, and PF3, and the thickness T12 of the first diffusion region 320 may be 100 nm to 300 nm.

On the other hand, if the laser with the focused state is used unlike the embodiment, the first conductive type dopant included in the first dopant layer is deeply diffused into an inside of the semiconductor substrate with a similar doping concentration gradient. Accordingly, as shown in the Comparative Example of FIG. 9, the doping profile may have a linear shape in the first doped portion and the first diffusion region and thus doping concentration gradients in the first doped portion and the first diffusion region may be the same as or similar to each other. Thus, the total doping concentration of the first diffusion region is relatively low and the thickness of the first diffusion region is relatively large.

As stated above, in the embodiment, by irradiating the laser 324 not focused or defocused onto the first dopant layer 322 during the doping process using the first dopant layer 322 and the laser 324, the doping profile of the first conductive type dopant can be adjusted and the thickness of the first diffusion region 320 can be minimized. Accordingly, the effect due to the first diffusion region 320 can be maximized and the recombination which may be generated due to the first diffusion region 320 can be minimized or prevented.

Figure 12:
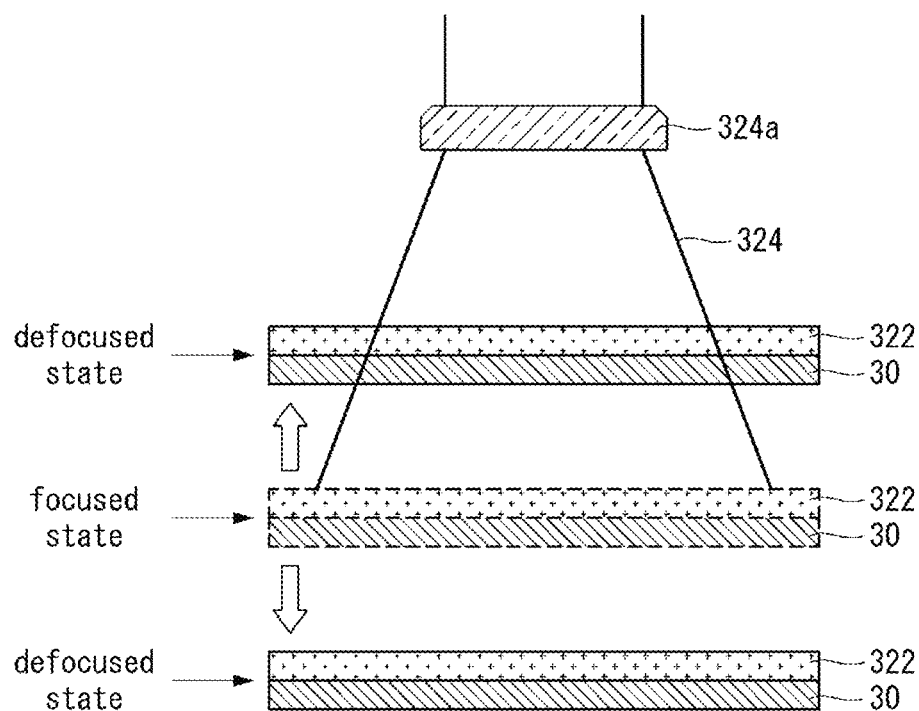
FIG. 12 schematically shows an example of the doping process shown in FIG. 10D and included in the method for manufacturing the solar cell.
Figure 13:
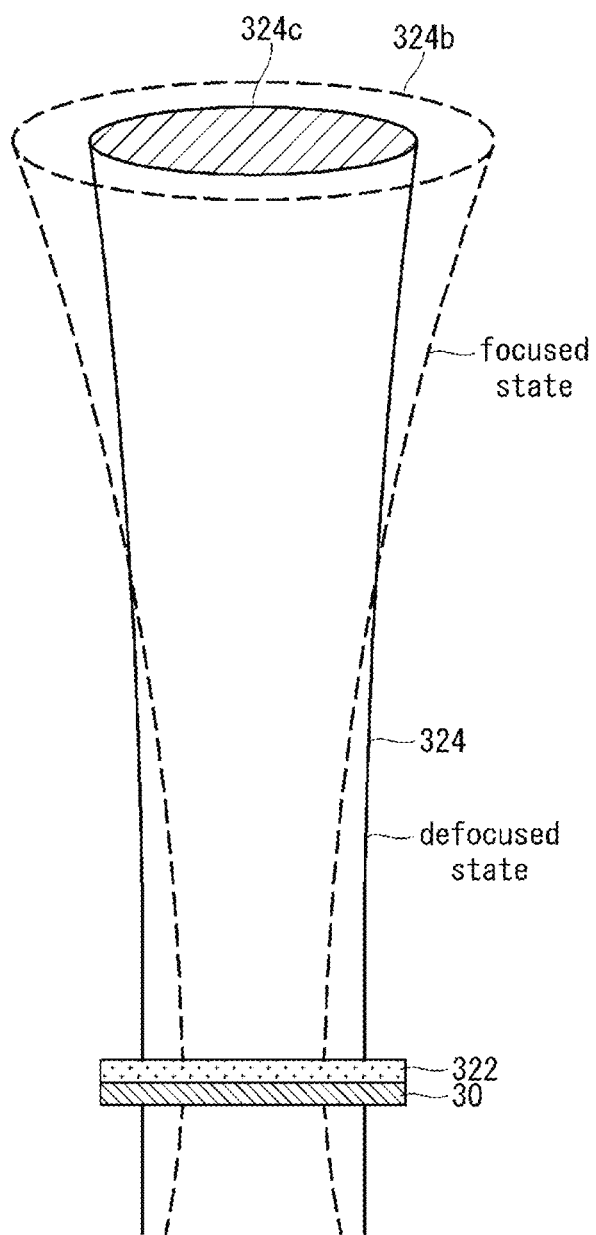
FIG. 13 schematically shows another example of the doping process shown in FIG. 10D and included in the method for manufacturing the solar cell.

Various methods are applied to a method for defocusing the laser 324 onto the first dopant layer 322. Methods for defocusing the laser 324 during the doping process in the embodiment will be described with reference to FIG. 12 and FIG. 13 together. FIG. 12 schematically shows an example of the doping process shown in FIG. 10D and included in the method for manufacturing the solar cell 100, and FIG. 13 schematically shows another example of the doping process shown in FIG. 10D and included in the method for manufacturing the solar cell 100. In FIG. 12 and FIG. 13, for clarity and simplicity of description, only the first dopant layer 322 and the semiconductor layer 30 are shown in the solar cell 100, and shapes of lenses 324a, 324b, 324c shown arbitrarily shown and thus the invention is not limited to the shape of lenses 324a, 324b, and 324c.

As an example, as shown in FIG. 12, the laser 324 is focused onto the first dopant layer 322 (that is, the laser 324 is irradiated so that the boundary line of the laser beam is clear as shown in (a) of FIG. 11), and then, the laser 324 is defocused onto the first dopant layer 322 by changing a position of the laser 324, more particularly, by increasing or decreasing a distance between the first dopant layer 322 and the laser 324. In this instance, the change in the distance between the first dopant layer 322 and the laser 324 may be 30 mm or less. That is, the distance between the first dopant layer 322 and the laser 324 is changed within 30 mm with respect to the focused state of the laser 324. If the distance change is more than 30 mm, it may be difficult to sufficiently transfer the energy by the laser 324 to the first dopant layer 322 and thus the doping process may be not smoothly performed. In this instance, the change in the distance between the first dopant layer 322 and the laser 324 for defocusing the laser 324 may be larger than the thickness of the first dopant layer 322. As an example, the change in the distance between the first dopant layer 322 and the laser 324 for defocusing the laser 324 may be 0.5 mm or more (as an example, 0.5 mm to 2 mm). This range is limited for sufficiently achieving the effect due to the laser 324 with the defocused state. However, the embodiments of the invention are not limited thereto. The lens 324a is used in FIG. 12 by example. However, the embodiments of the invention are not limited thereto.

As another example, as shown in FIG. 13, the laser 324b is focused onto the first dopant layer 322 using a first lens 324b having a first magnification (that is, the laser 324 is irradiated so that the boundary line of the laser beam is clear as shown in (a) of FIG. 11), and then, the laser 324 is defocused onto the first dopant layer 322 by replacing the first lens 324b having the first magnification with the second lens 324c having a second magnification different from the first magnification. The second magnification of the second lens 324c may be larger than or smaller than the first magnification of the first lens 324b. As shown in FIG. 13, the laser 324 can be varied to have the defocused state by changing the lens 324b and 324c. The laser beam by the laser 324 with the defocused state may be larger than or smaller than the laser beam by the laser 324 with the focused state. The first or second magnification of the first and second lenses 324b and 324c may be X1 to X10. However, the embodiments of the invention are not limited thereto.

Referring to FIG. 10D again, in the embodiment, various kinds of lasers may be used as the laser 324 for the doping process. For example, the laser 324 may have a wavelength of 1064 nm or less. However, the embodiments of the invention are not limited thereto.

As an example, the laser 324 may be a pulsed wave laser having a power within a certain time and not having a power with another certain time. Then, by applying sufficient energy to the first dopant layer 322 in a short time, the first conductive type dopant can be stably diffused. As an example, the laser 324 may have a pulse width ranging from femtoseconds (fs) to nanoseconds (ns). Within the pulse with of the laser 324, the energy necessary to the doping process may be sufficiently supplied. The process time increases if the pulse width of the laser 324 is less than femtoseconds, while the first conductive region 32 may have not the desired doping concentration and property if the pulse width of the laser 324 is more than nanoseconds. On the other hand, unlike in the embodiment, a continuous wave laser having continuous and uniform power may not sufficiently supply energy to the first dopant layer 322. However, the embodiments of the invention are not limited thereto. Therefore, the laser 324 may have a pulse width different from the above, and may be a continuous wave laser.

The laser beam of the laser 324 may have a size of 10 um to 2 mm. This range is limited to be suitable to be applied to a doping process. In this instance, the process time increases if the size of the laser beam is less than 10 um, while the first conductive region 32 may have not the desired doping concentration and property if the size of the laser beam is more than 2 mm. However, the embodiments of the invention are not limited to the size of the laser beam, an irradiation method of the laser beam, and so on.

Subsequently, as shown in FIG. 10E, the first dopant layer 322 may be removed. The first dopant layer 322 may be removed by various methods. As an example, the first dopant layer 322 may be removed by a wet process using a material (as an example, a solution) being able to remove the first dopant layer 322.

In this instance, an anti-reflection structure may be formed together at the front surface of the semiconductor substrate 10. The anti-reflection structure may be formed by a texturing.

Subsequently, as shown in FIG. 10F, the second conductive region 34, the second diffusion region 340, and the front surface field region 130 may be formed. As an example, the second conductive region 34, the second doped portion 204, the second diffusion region 340, and the front surface field region 130 may be simultaneously formed by the same process, that is, a thermal diffusion using a gas including the second conductive type dopant. When the doping process for forming the second conductive region 34 is different from the doping process for forming the first conductive region 32, the process can be simplified.

However, the embodiments of the invention are not limited thereto. The second conductive region 34, the front surface field region 130, and so on may be formed by using various methods, such as an ion implantation, or a thermal diffusion, which is a heat-treatment using a gas including a dopant or a heat-treatment performed after a formation of a doping layer.

In the embodiment, the second conductive region 34 and the second diffusion region 340 are formed after forming the first conductive region 32 and the first diffusion region 320, by example. However, the embodiments of the invention are not limited thereto. As another example, the first dopant layer 322 having the first conductive type dopant and a second dopant layer having the second conductive type dopant are formed, and then, the doping process for forming the first and second conductive regions 32 and 34 is simultaneously performed by the laser 324. Then, although the second conductive region 34, the second doped portion 204, and the second diffusion region 340 has the above doping profile having the first to third doping profiles PF1, PF2, and PF3 as shown in FIG. 9, although a thickness, a doping concentration, a concentration gradient, and so on thereof may be different from those shown in FIG. 9. In the embodiment, both of the first and second diffusion regions 320 and 340 are included, by example, but the second diffusion region 340 may be not included.

Figure 10G:
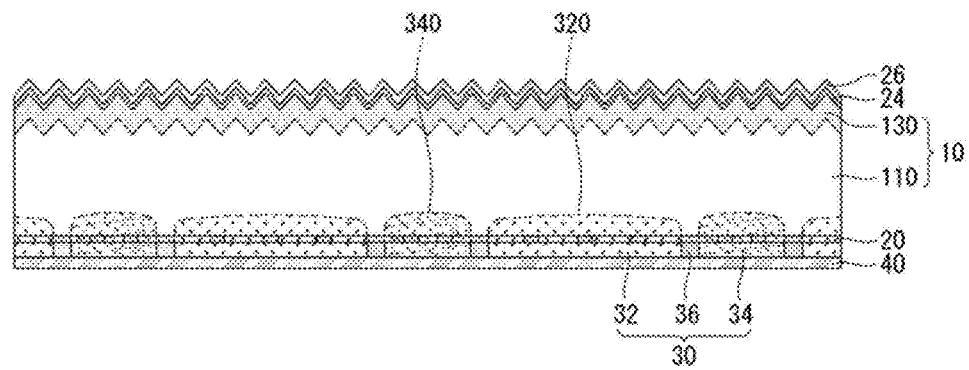

Subsequently, as shown in FIG. 10G, other insulation films are formed on the front surface and the back surface of the semiconductor substrate 10.

Figure 10H:
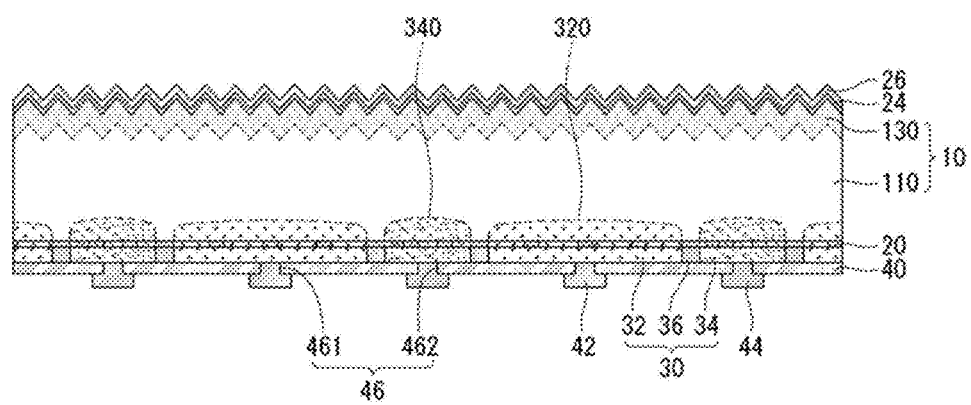

Subsequently, as illustrated in FIG. 10H, first and second electrodes 42 and 44, which are respectively connected to the first and second conductive regions 32 and 34, are formed.

According to the embodiment, the diffusion regions 320 and 340 having a desired doping profile, a desired thickness, and so on can be formed by a simple process. Accordingly, the method for manufacturing the solar cell 100 having high efficiency can be simplified, thereby achieving high productivity.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell, comprising:
   a semiconductor substrate;
   a control passivation film on one surface of the semiconductor substrate, the control passivation film being formed of a dielectric material; and
   a semiconductor layer on the control passivation film, the semiconductor layer comprising a first conductive region having a first conductive type and a second conductive region having a second conductive type opposite to the first conductive type,
   wherein the semiconductor substrate further comprises a diffusion region including at least one of a first diffusion region and a second diffusion region adjacent to the control passivation film,
   wherein the first diffusion region is locally formed to correspond to the first conductive region and has a doping concentration lower than a doping concentration of the first conductive region,
   wherein the second diffusion region is locally formed to correspond to the second conductive region and has a doping concentration lower than a doping concentration of the second conductive region, and
   wherein the control passivation film comprises at least one of a first doped portion locally formed between the first conductive region and the first diffusion region and a second doped portion locally formed between the second conductive region and the second diffusion region.

2. The solar cell according to claim 1, wherein the control passivation film is an amorphous film consisting of an amorphous structure or an amorphous film including the amorphous structure and a partially-crystallized portion.

3. The solar cell according to claim 1, further comprising:
   an insulating film on the semiconductor substrate or the semiconductor layer,
   wherein the control passivation film is thinner than the insulating film, and
   wherein the control passivation film comprises a portion having a doping concentration higher than a doping concentration of the insulating film.

4. The solar cell according to claim 1, wherein the first doped portion or the second doped portion includes a low doped portion and a highly doped portion having a doping concentration higher than a doping concentration of the low doped portion.

5. The solar cell according to claim 1, wherein, when the first or second conductive region, the control passivation film, and the diffusion region are viewed in a thickness direction thereof, a doping concentration continuously decreases toward an inside of the semiconductor substrate, and
   wherein an absolute value of a doping concentration gradient in the diffusion region is larger than an absolute value of a doping concentration gradient in the first or second conductive region.

6. The solar cell according to claim 1, wherein the diffusion region is thicker than each of the first conductive region and the second conductive region.

7. The solar cell according to claim 1, wherein the diffusion region comprises the first diffusion region and the second diffusion region, and
   wherein the control passivation film comprises the first doped portion and the second doped portion.

8. The solar cell according to claim 7, wherein the first diffusion region and the second diffusion region are spaced apart from each other and a base region is positioned between the first diffusion region and the second diffusion region,
   wherein a barrier region is positioned between the first conductive region and the second conductive region, and
   wherein the control passivation film comprises an undoped portion between the semiconductor substrate and the barrier region.

9. The solar cell according to claim 7, wherein the semiconductor substrate comprises a base region having the second conductive type, and
   wherein the second diffusion region is thicker than the first diffusion region.

10. The solar cell according to claim 7, wherein the semiconductor substrate comprises a base region having the second conductive type, and
    wherein, when the first and second diffusion regions are viewed in a thickness direction thereof, an absolute value of a doping concentration gradient in the second diffusion region is smaller than an absolute value of a doping concentration gradient in the first diffusion region.

11. The solar cell according to claim 1, wherein the semiconductor layer has a poly-crystalline structure with a nanometer-sized grain.

12. The solar cell according to claim 1, wherein a doping concentration of a first or second conductive type dopant continuously decreases from the first or second conductive region toward the first or the second diffusion region via the control passivation film in a doping profile,
    wherein the doping profile comprises a first doping profile and a second doping profile different from the first doping profile, the first doping profile being positioned in the control passivation film or a portion of the first or second conductive region adjacent to the control passivation film and the second doping profile being positioned in a portion of the first or second diffusion region adjacent to the control passivation film, and
    wherein an absolute value of a second doping concentration gradient in the second doping profile is smaller than an absolute value of a first doping concentration gradient in the first doping profile.

13. The solar cell according to claim 12, wherein the first or second diffusion region has a thickness of 100 nm to 300 nm, or
    wherein the first or second diffusion region has a thickness the same as or smaller than a thickness of the first or second conductive region.

* * * * *